United States Patent
Duriez et al.

(10) Patent No.: US 10,276,719 B1
(45) Date of Patent: Apr. 30, 2019

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Blandine Duriez, Brussels (BE); Gerben Doornbos, Leuven (BE); Mark Van Dal, Linden (BE); Martin Christopher Holland, Bertem (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/966,761

(22) Filed: Apr. 30, 2018

(51) Int. Cl.
| | |
|---|---|
| *H01L 29/78* | (2006.01) |
| *H01L 29/66* | (2006.01) |
| *H01L 29/08* | (2006.01) |
| *H01L 21/8238* | (2006.01) |
| *H01L 21/02* | (2006.01) |
| *H01L 21/324* | (2006.01) |
| *H01L 21/768* | (2006.01) |

(52) U.S. Cl.
CPC ...... *H01L 29/785* (2013.01); *H01L 21/02304* (2013.01); *H01L 21/324* (2013.01); *H01L 21/76802* (2013.01); *H01L 21/76841* (2013.01); *H01L 21/823814* (2013.01); *H01L 21/823821* (2013.01); *H01L 29/0847* (2013.01); *H01L 29/66545* (2013.01)

(58) Field of Classification Search
CPC .............. H01L 29/785; H01L 29/0847; H01L 29/66545; H01L 21/823814; H01L 21/76841; H01L 21/76802; H01L 21/324; H01L 21/823821

See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2015/0131254 A1* | 5/2015 | Kim ............... H05K 1/0271 361/783 |
| 2016/0240502 A1* | 8/2016 | Lin ................... H01L 24/16 |

\* cited by examiner

*Primary Examiner* — Yosef Gebreyesus
(74) *Attorney, Agent, or Firm* — McDermott Will & Emery LLP

(57) ABSTRACT

In a method of manufacturing a semiconductor device, an opening is formed in an interlayer dielectric layer such that a source/drain region is exposed in the opening. A first semiconductor layer is formed to fully cover the exposed source/drain region within the opening. A heating process is performed to make an upper surface of the first semiconductor layer substantially flat. A conductive contact layer is formed over the first semiconductor layer.

20 Claims, 40 Drawing Sheets

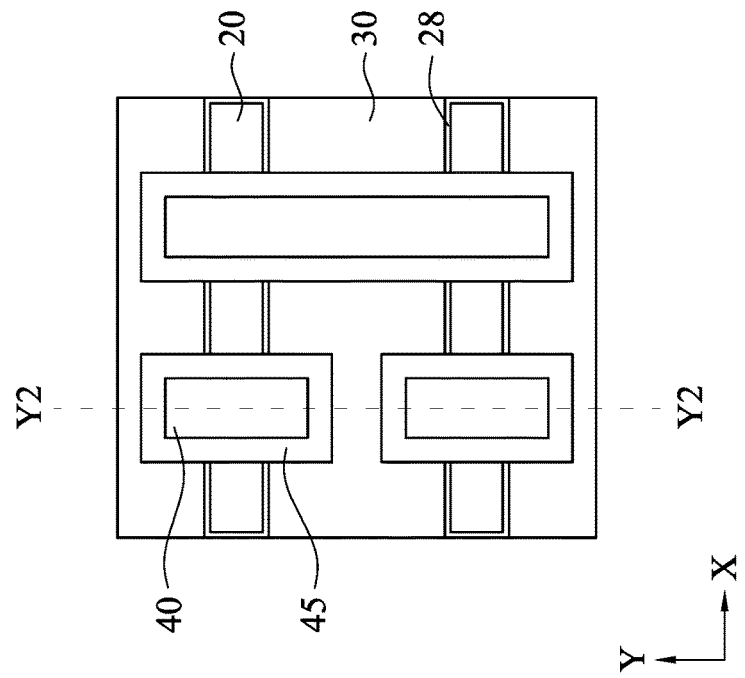
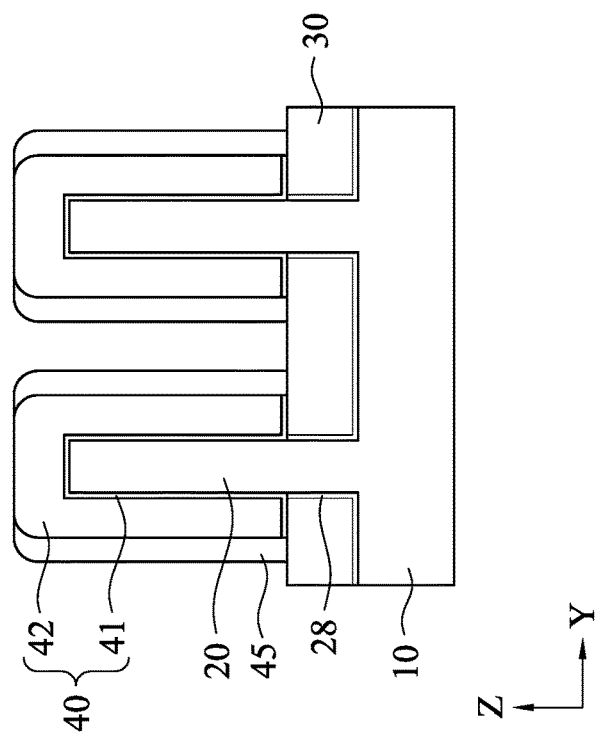
FIG. 6B
FIG. 6A

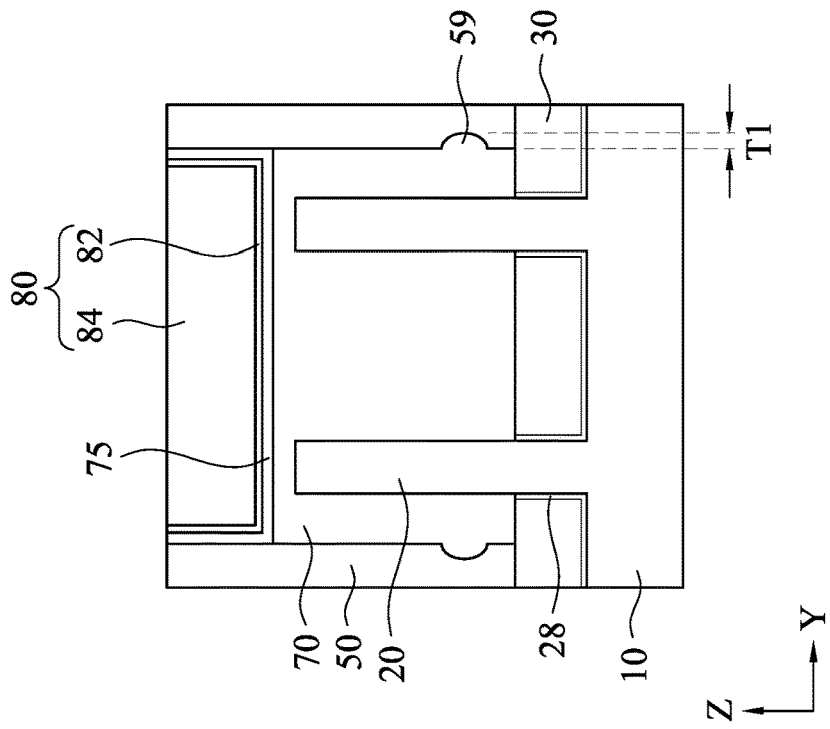
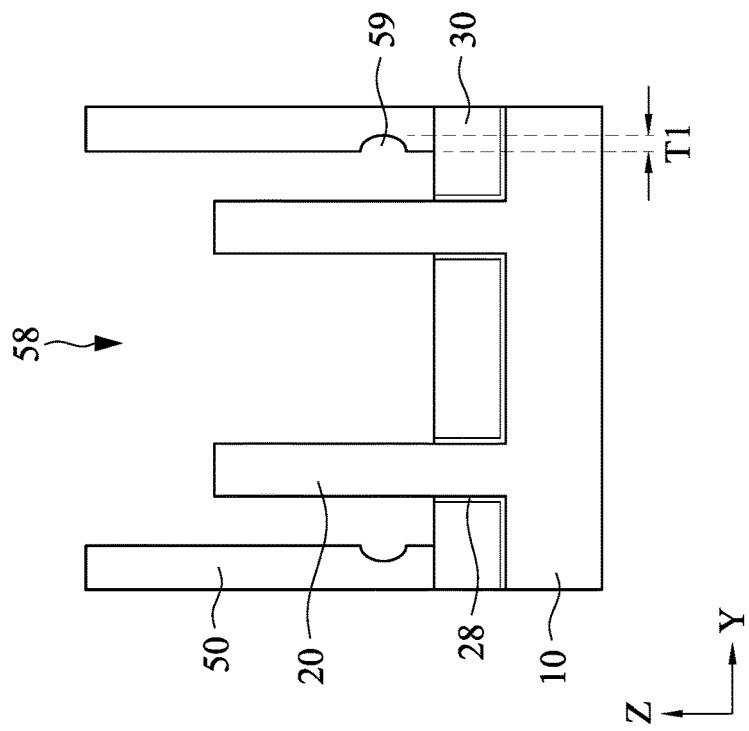
FIG. 19A
FIG. 19B

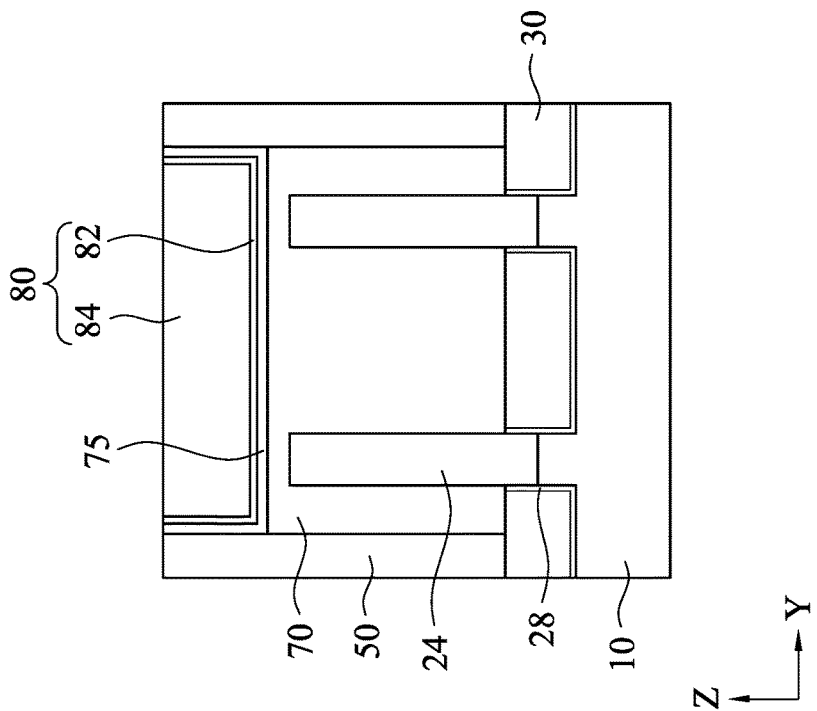
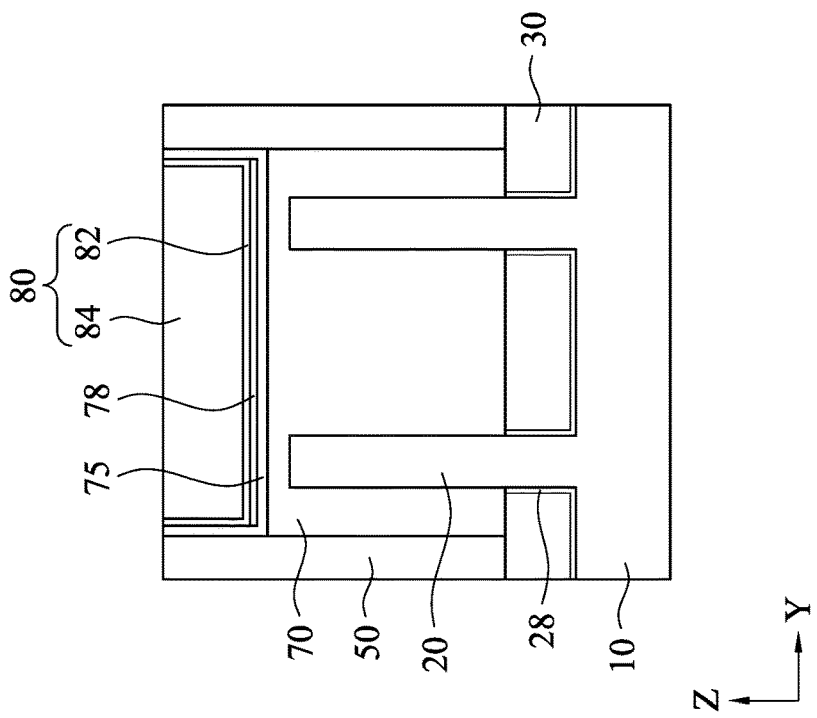

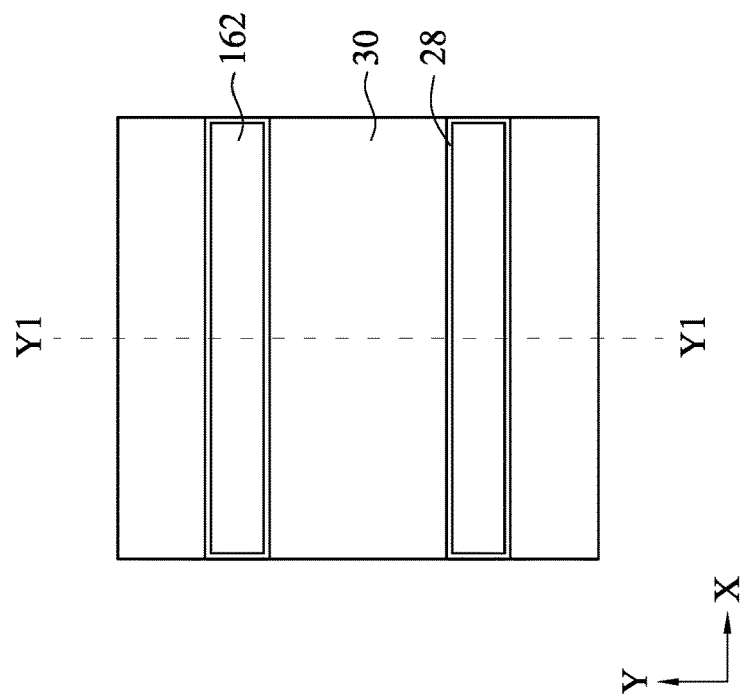
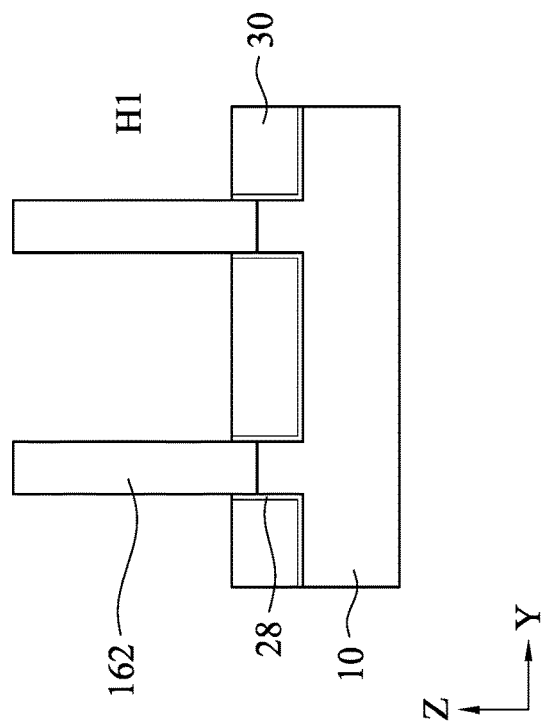
FIG. 22B
FIG. 22A

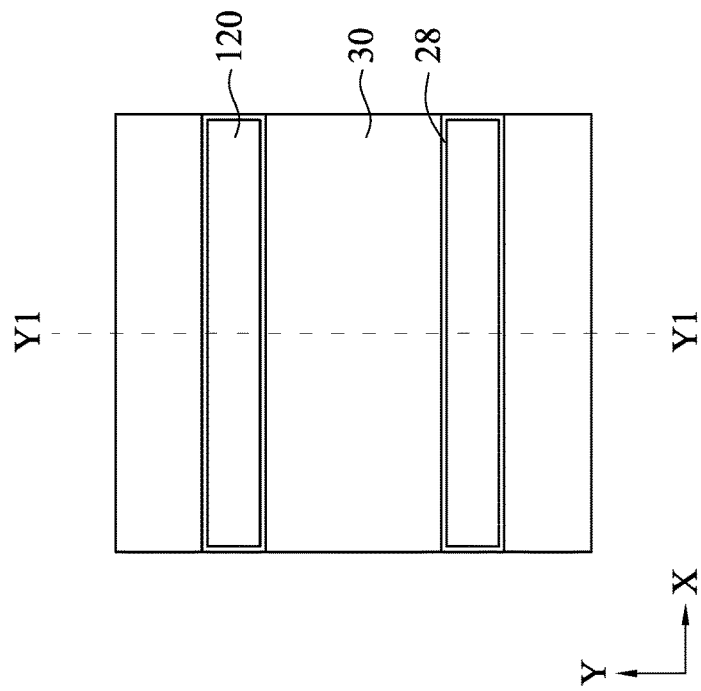
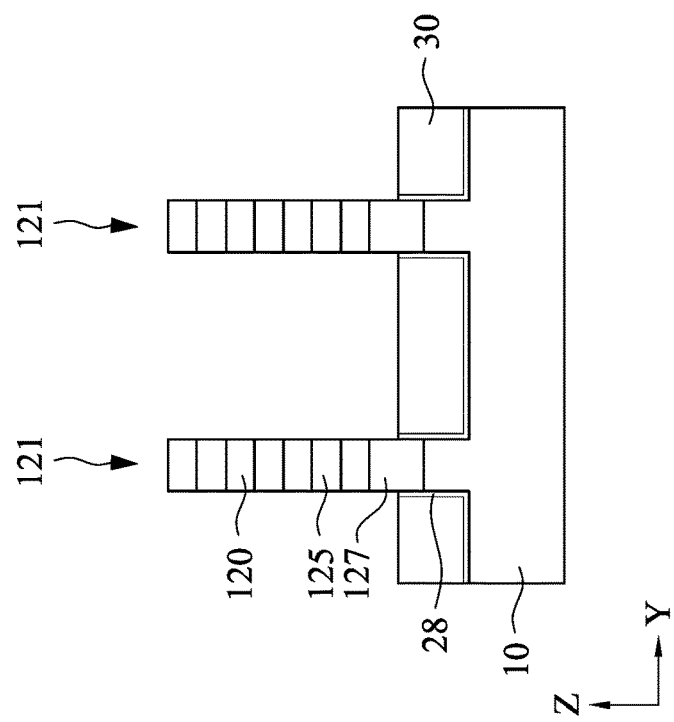
FIG. 27B
FIG. 27A

METHOD OF MANUFACTURING A SEMICONDUCTOR DEVICE AND A SEMICONDUCTOR DEVICE

TECHNICAL FIELD

The disclosure relates to a semiconductor integrated circuit, and more particularly to a semiconductor device having fin field effect transistors and their manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode layer is adjacent to three side surfaces of a channel region with a gate dielectric layer interposed therebetween. Because the gate structure surrounds (wraps) the fin on three surfaces, the transistor essentially has three gates controlling the current through the fin or channel region. The current driving capacity of the FinFET is generally determined by a number of the fins, a fin width and a fin height at the channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A and 6B show one of the various stages of sequential processes for manufacturing a semiconductor device according to an embodiment of the present disclosure.

FIGS. 19A and 19B show stages of sequential processes for manufacturing a semiconductor device according to another embodiment of the present disclosure.

FIGS. 20A, 2B, 20C and 20D show semiconductor devices according to other embodiments of the present disclosure.

FIGS. 22A and 22B show one of the various stages of sequential processes for manufacturing a semiconductor device according to another embodiment of the present disclosure.

FIGS. 27A and 27B show one of the various stages of sequential processes for manufacturing a semiconductor device according to another embodiment of the present disclosure.

DETAILED DESCRIPTION

Figure 1B:
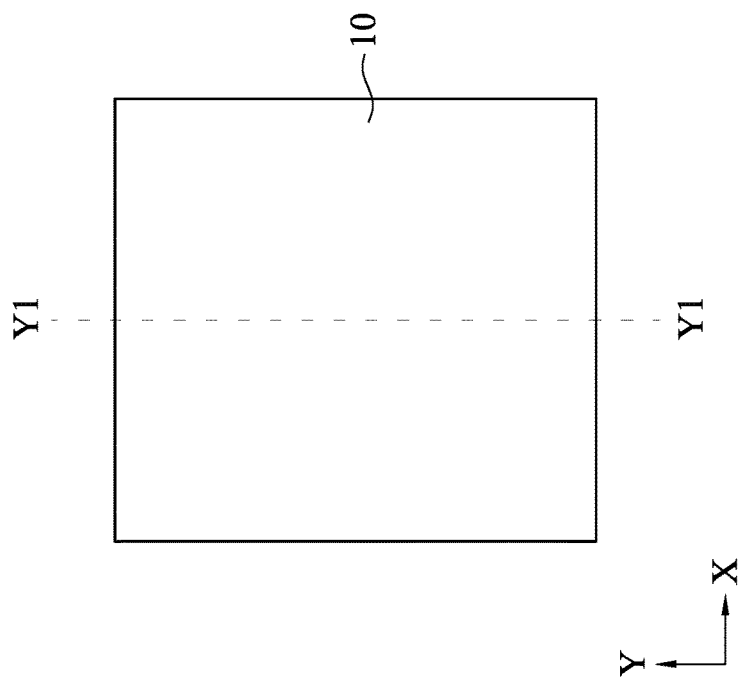
FIGS. 1A and 1B show one of the various stages of sequential processes for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In this disclosure, the phrase "at least one of A, B and C means "A, B and/or C" (A, B, C, A+B, A+C, B+C A+B+C), and does not mean one from A, one from B and one from C, unless otherwise described.

With the decrease of dimensions of semiconductor devices, for example, FinFETs and GAA FETs, structures and/or configurations of source/drain regions need to be improved to decrease contact resistance between a conductive contact (metallic layer) and the source/drain regions (semiconductor), and to provide appropriate stress to a channel region by the source/drain regions. To apply the stress to the source/drain regions of FinFETs or GAA FETs, one or more epitaxial semiconductor layers are formed. To decrease the contact resistance, a wrap-around contact that covers the top and side faces of the fin source/drain regions is employed.

However, the source/drain epitaxial layer tends to have a diamond cross sectional shape connecting adjacent fin source/drain structures. In particular, a void is often formed between the fin structures, which causes various issues. In the wrap-around contact structure, no epitaxial semiconductor layer is generally formed, and thus the structure does not provide stress to the channel region. Further, even though the contact resistance can be reduced with the wrap-around structure, fin volume is reduced and thus fin resistance may increase.

In the present disclosure, source/drain epitaxial structures having a flat top surface for FinFETs and GAA FETs and fabrication method thereof are provided.

In the following embodiments, material, configurations, dimensions and/or processes of one embodiment may be employed in another embodiment, unless otherwise described, and detailed explanation thereof may be omitted. In the following embodiments, a semiconductor (e.g., Si, Ge, SiGe, etc), a semiconductor layer, and an epitaxial layer generally and the like refer to single crystalline, unless otherwise explained.

FIGS. 1-17B show sequential processes for manufacturing a semiconductor device having FinFETs with a flat-top source/drain epitaxial layer according to an embodiment of the present disclosure. It is understood that additional operations can be provided before, during, and after processes shown by FIGS. 1-17B, and some of the operations described below can be replaced or eliminated, for additional embodiments of the method. The order of the operations/processes may be interchangeable. In FIGS. 1-17B, the "A" figures (FIG. 1A, 2A, . . . ) show cross sectional views along the Y direction, and the "B" figures (FIGS. 1B, 2B, . . . ) show plan views (top views).

Figure 1A:
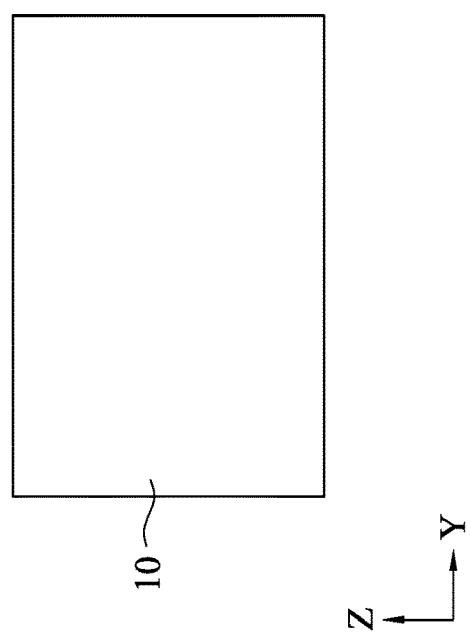

FIGS. 1A and 1B show one of the various stages of sequential processes for manufacturing a semiconductor device having FinFETs with a flat-top source/drain epitaxial layer according to an embodiment of the present disclosure. FIG. 1A is a cross sectional view corresponding to line Y1-Y1 of FIG. 1B.

As shown in FIGS. 1A and 1B, a semiconductor substrate 10 is provided. In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity).

Figure 2B:
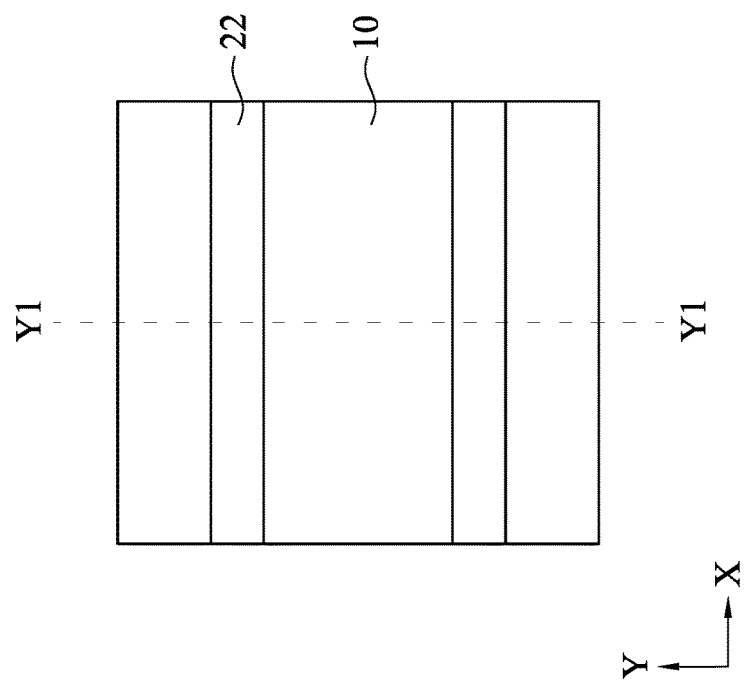
FIGS. 2A and 2B show one of the various stages of sequential processes for manufacturing a semiconductor device according to an embodiment of the present disclosure.
Figure 2A:
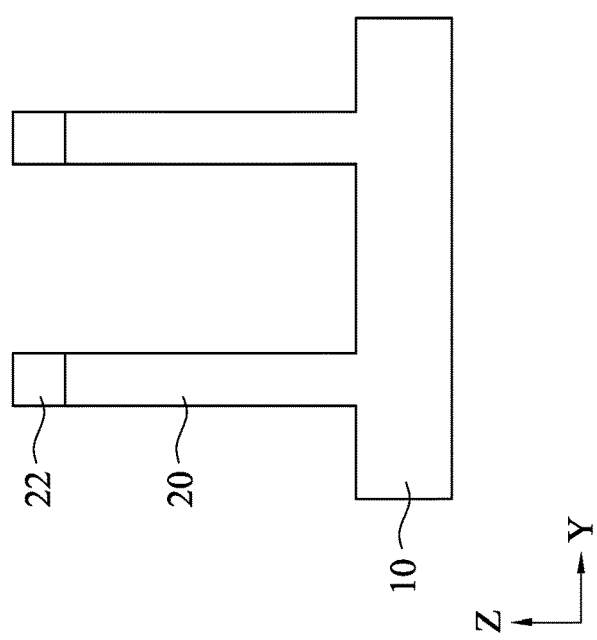

As shown in FIGS. 2A and 2B, fin structures 20 are formed over a substrate 10. The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures can be patterned by using a hard mask pattern 22 as an etching mask. In some embodiments, the hard mask pattern 22 includes a first mask layer and a second mask layer disposed on the first mask layer. The first mask layer is a pad oxide layer made of a silicon oxide, which can be formed by a thermal oxidation. The second mask layer is made of silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 22 by using patterning operations including photolithography and etching. Then, the substrate 10 is patterned by using the hard mask pattern into fin structures 20, both extending in the X direction. In FIGS. 2A and 2B, two fin structures 20 are arranged in the Y direction. But the number of the fin structures is not limited to two, and may be one or three or more. In some embodiments, one or more dummy fin structures are formed on both sides of the fin structures to improve pattern fidelity in the patterning operations.

The width of the upper portion of the fin structures 20 along the Y direction is in a range from about 5 nm to about 40 nm in some embodiments, and is in a range from about 10 nm to about 20 nm in other embodiments. The height along the Z direction of the fin structure is in a range from about 100 nm to about 200 nm in some embodiments.

Figure 3B:
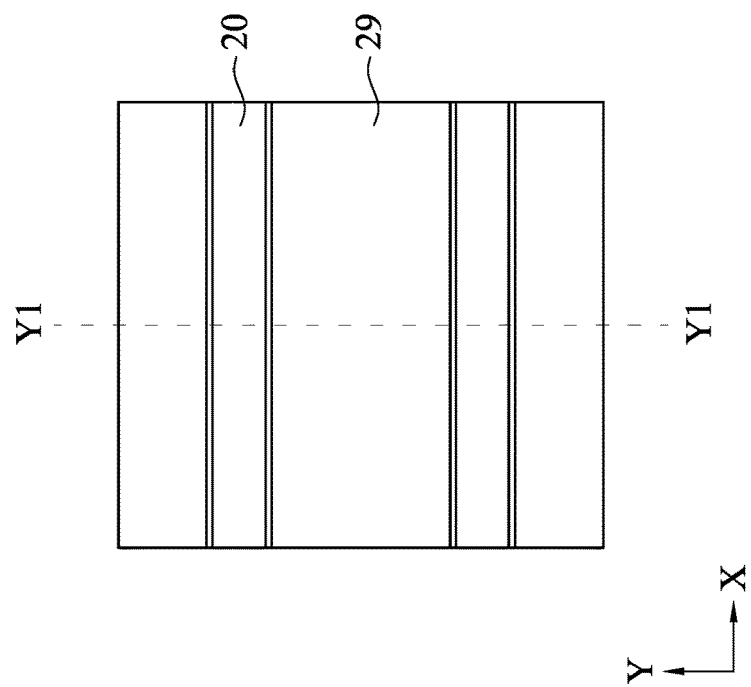
FIGS. 3A and 3B show one of the various stages of sequential processes for manufacturing a semiconductor device according to an embodiment of the present disclosure.
Figure 3A:
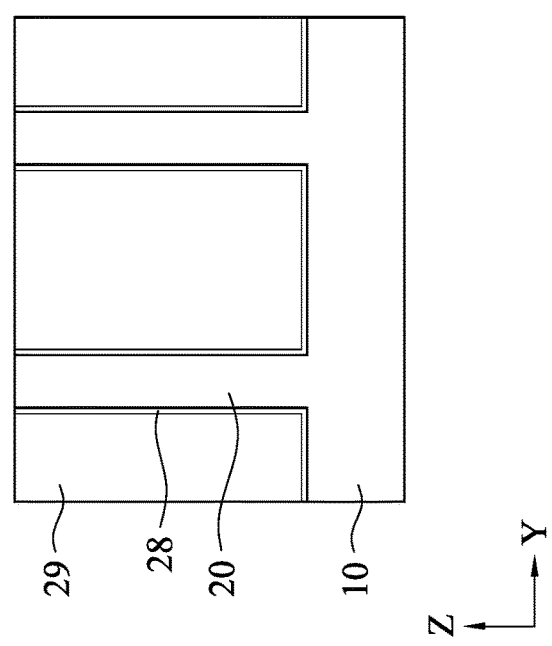

FIGS. 3A and 3B show one of the various stages of sequential processes for manufacturing a semiconductor device having FinFETs with a flat-top source/drain epitaxial layer according to an embodiment of the present disclosure. FIG. 3A is a cross sectional view corresponding to line Y1-Y1 of FIG. 3B.

After the fin structures 20 are formed, a first insulating material layer 29 including one or more layers of insulating material is formed over the substrate 10 so that the fin structures 20 are fully embedded in the first insulating material layer 29. The insulating material for the first insulating material layer 29 may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first insulating material layer 29 is made of silicon oxide. An annealing operation may be performed after the formation of the first insulating material layer 29. Then, a planarization operation, such as a chemical mechanical polishing (CMP) method and/or an etch-back method, is performed such that the hard mask patterns 22 are removed and upper surfaces of the fin structures 20 are exposed from the first insulating material layer 29 as shown in FIG. 3A.

In some embodiments, one or more fin liner layers 28 are formed over the fin structures before forming the first insulating material layer 29. The fin liner layer 28 may be made of silicon nitride or a silicon nitride-based material (e.g., SiON or SiCN).

Figure 4B:
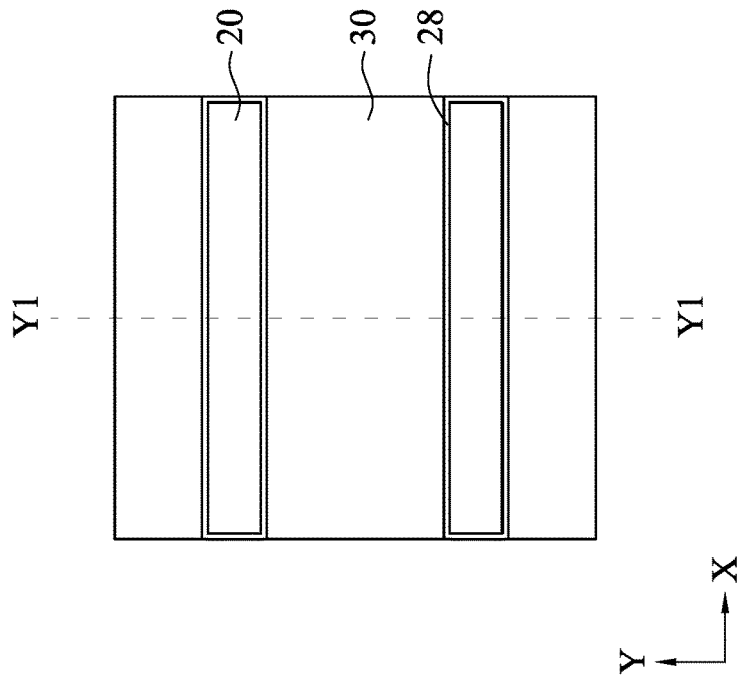
FIGS. 4A and 4B show one of the various stages of sequential processes for manufacturing a semiconductor device according to an embodiment of the present disclosure.
Figure 4A:
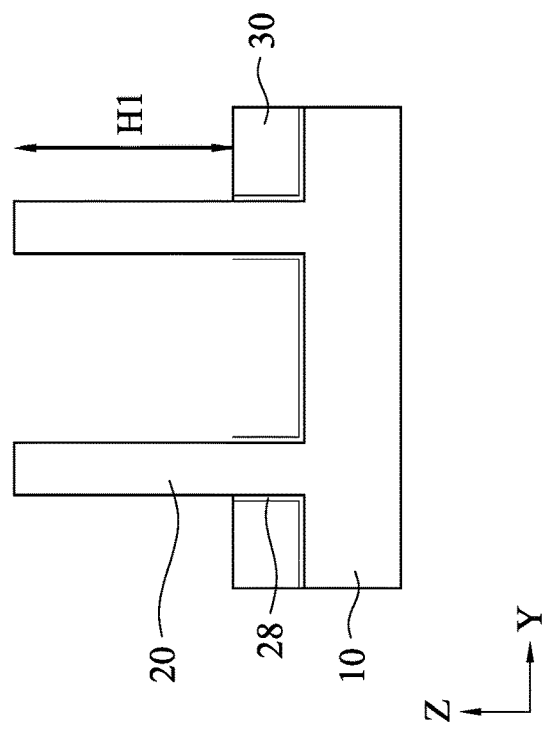

FIGS. 4A and 4B show one of the various stages of sequential processes for manufacturing a semiconductor device having FinFETs with a flat-top source/drain epitaxial layer according to an embodiment of the present disclosure. FIG. 4A is a cross sectional view corresponding to line Y1-Y1 of FIG. 4B.

Then, as shown in FIG. 4A, the first insulating material layer 29 is recessed to form a first isolation insulating layer 30 so that the upper portions of the fin structures 20 are exposed. With this operation, the fin structures 20 are electrically separated from each other by the first isolation insulating layer 30, which is also called a shallow trench isolation (STI). After the recess etching, the height H1 of the exposed fin structures is in a range from about 50 nm to about 100 nm in some embodiments, and is in a range from about 60 nm to about 80 nm in other embodiments.

Figure 5B:
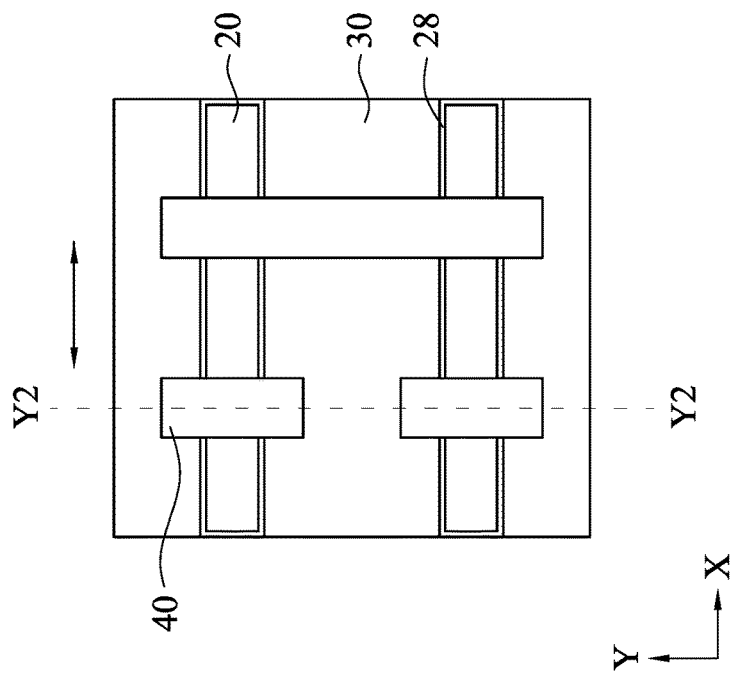
FIGS. 5A and 5B show one of the various stages of sequential processes for manufacturing a semiconductor device according to an embodiment of the present disclosure.
Figure 5A:
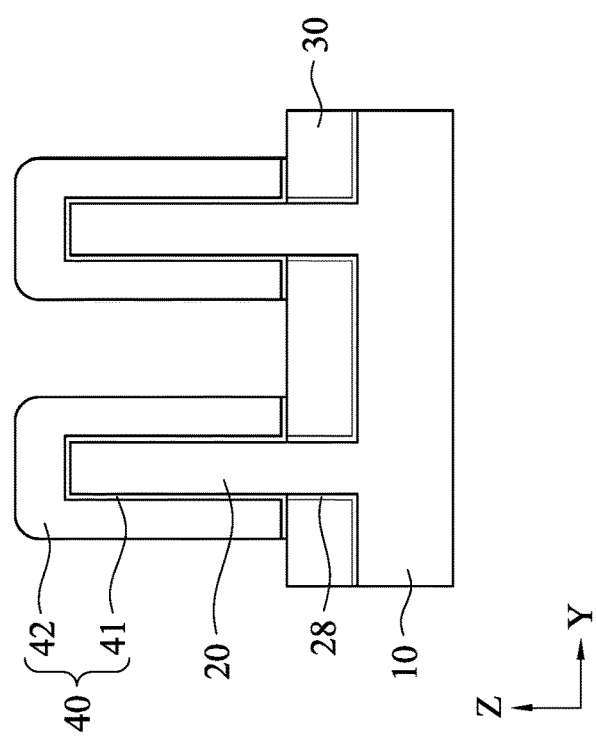

FIGS. 5A and 5B show one of the various stages of sequential processes for manufacturing a semiconductor device having FinFETs with a flat-top source/drain epitaxial layer according to an embodiment of the present disclosure. FIG. 5A is a cross sectional view corresponding to line Y1-Y1 of FIG. 5B.

After the isolation insulating layer 30 is formed, a dummy gate structure 40 is formed, as shown in FIGS. 5A and 5B. The dummy gate structure 40 includes a dummy gate dielectric layer 41 and a dummy gate electrode layer 42. The dummy gate dielectric layer 41 includes one or more layers of insulating material, such as a silicon oxide-based material. In one embodiment, silicon oxide formed by CVD is used. The thickness of the dummy gate dielectric layer 41 is in a range from about 1 nm to about 5 nm in some embodiments.

The dummy gate structure 40 is formed by first blanket depositing the dummy gate dielectric layer 41 over the exposed fin structures 20 and the upper surface of the isolation insulating layer 30. A dummy gate electrode layer 42 is then blanket deposited on the dummy gate dielectric layer 41, such that the fin structures 20 are fully embedded in the dummy gate electrode layer 42. The dummy gate electrode layer 42 includes silicon such as polycrystalline silicon (polysilicon) or amorphous silicon. In some embodiments, the dummy gate electrode layer 42 is made of polysilicon. The thickness of the dummy gate electrode layer 42 is in a range from about 100 nm to about 200 nm in some embodiments. In some embodiments, the dummy gate electrode layer 42 is subjected to a planarization operation. The dummy gate dielectric layer 41 and the dummy gate electrode layer 42 are deposited using CVD, including LPCVD and PECVD, PVD, ALD, or other suitable process. Subsequently, a mask layer is formed over the dummy gate electrode layer. The mask layer can be a resist pattern or a hard mask pattern.

Next, a patterning operation is performed on the mask layer and the dummy gate electrode layer 42 is patterned into the dummy gate structures 40, as shown in FIGS. 5A and 5B. By patterning the dummy gate structures, the upper portions of the fin structures 20, which are to be source/drain regions, are partially exposed on opposite sides of the dummy gate structures 40, as shown in FIG. 5B. In this disclosure, a source and a drain are interchangeably used and the structures thereof are substantially the same. In FIG. 5B, two dummy gate structures 40 are formed on two fin structures 20, respectively, and one dummy gate structure 40 is formed over two fin structures 20. However, the layout is not limited to FIG. 5B.

The width of the dummy gate structures 40 in the Y direction is in a range from about 5 nm to about 30 nm in some embodiments, and is in a range from about 7 nm to about 15 nm in other embodiments. A pitch of the dummy gate structures is in a range from about 10 nm to about 50 nm in some embodiments, and is in a range from about 15 nm to about 40 nm in other embodiments.

FIGS. 6A and 6B show one of the various stages of sequential processes for manufacturing a semiconductor device having FinFETs with a flat-top source/drain epitaxial layer according to an embodiment of the present disclosure. FIG. 6A is a cross sectional view corresponding to line Y2-Y2 of FIG. 6B.

After the dummy gate structures 40 are formed, a blanket layer of an insulating material for sidewall spacers 45 is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In one embodiment, the insulating material of the blanket layer is different from the materials of the first isolation insulating layer and the second isolation insulating layer, and is made of a silicon nitride-based material, such as silicon nitride, SiON, SiOCN or SiCN and combinations thereof. In some embodiments, the blanket layer (sidewall spacers 45) is made of silicon nitride. The sidewall spacers 45 are formed on opposite sidewalls of the dummy gate structures 40, by anisotropic etching, as shown in FIGS. 6A and 6B.

Figure 7B:
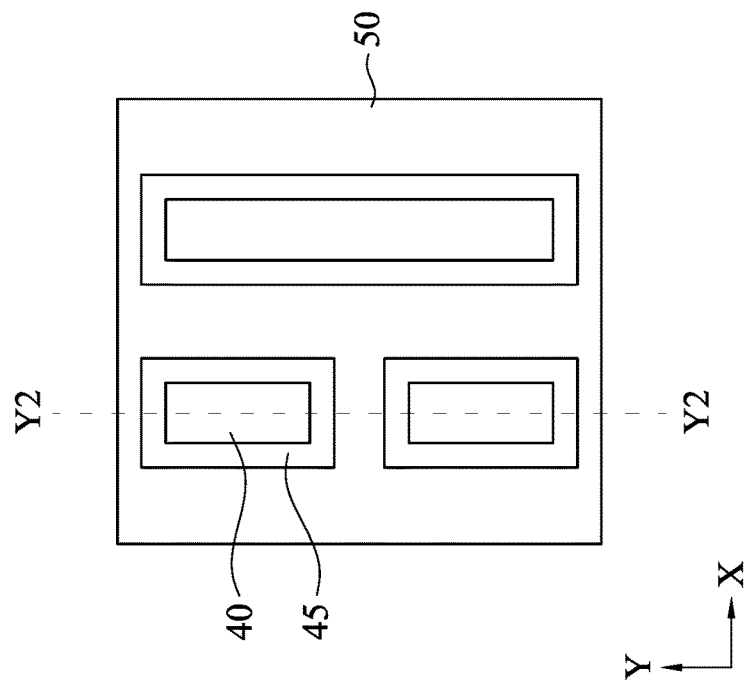
FIGS. 7A and 7B show one of the various stages of sequential processes for manufacturing a semiconductor device according to an embodiment of the present disclosure.
Figure 7A:
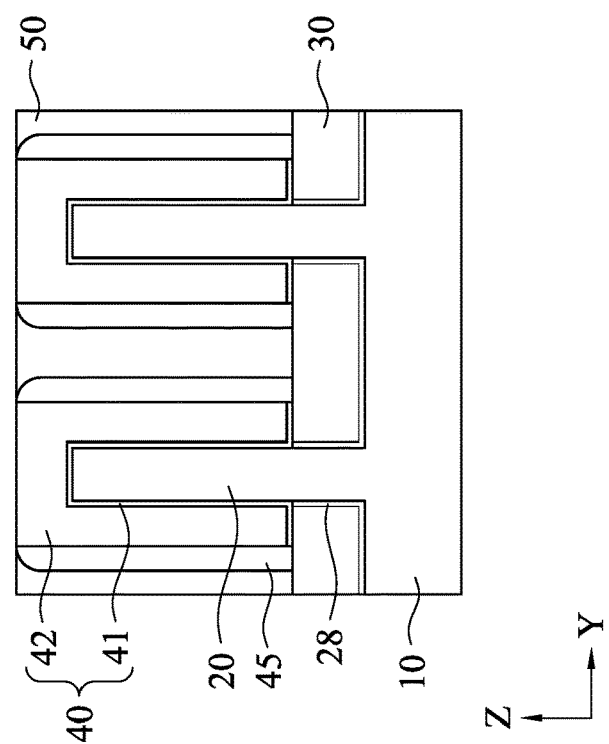

FIGS. 7A and 7B show one of the various stages of sequential processes for manufacturing a semiconductor device having FinFETs with a flat-top source/drain epitaxial layer according to an embodiment of the present disclosure. FIG. 7A is a cross sectional view corresponding to line Y2-Y2 of FIG. 7B.

Subsequently, an interlayer dielectric (ILD) layer 50 is formed. The materials for the ILD layer 50 include compounds comprising Si, O, C and/or H, such as silicon oxide, SiCOH and SiOC. Organic materials, such as polymers, may be used for the ILD layer 50. After the ILD layer 50 is formed, a planarization operation, such as CMP, is performed, so that the top portions of the dummy gate electrode layers of the dummy gate structures 40 are exposed, as shown in FIG. 7A. In some embodiments, a hard mask layer (not shown) is used to pattern the dummy gate structure 40, and the planarization operation removes the hard mask layer in some embodiments.

Figure 8B:
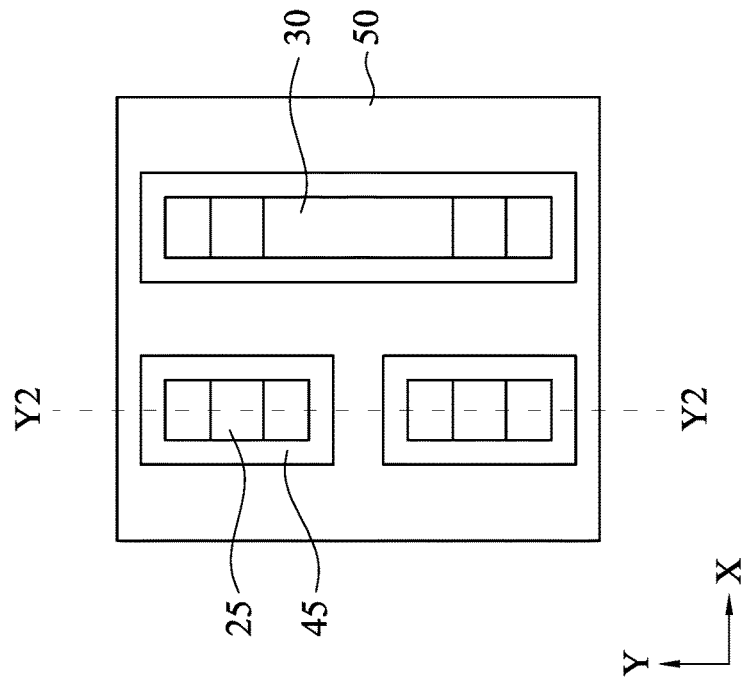
FIGS. 8A and 8B show one of the various stages of sequential processes for manufacturing a semiconductor device according to an embodiment of the present disclosure.
Figure 8A:
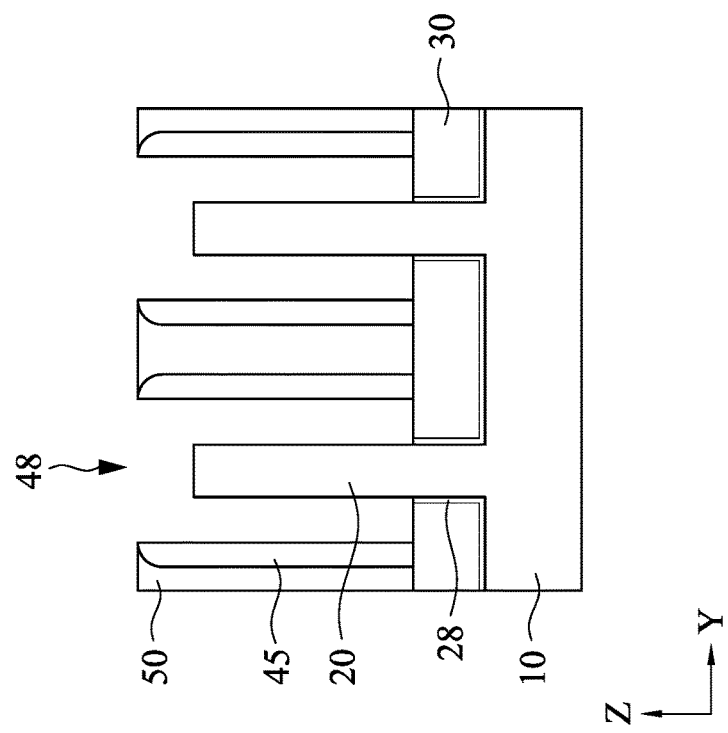

FIGS. 8A and 8B show one of the various stages of sequential processes for manufacturing a semiconductor device having FinFETs with a flat-top source/drain epitaxial layer according to an embodiment of the present disclosure. FIG. 8A is a cross sectional view corresponding to line Y2-Y2 of FIG. 8B.

Next, as shown in FIGS. 8A and 8B, the dummy gate structures 40 are removed, thereby forming gate spaces 48, in which the upper portions of the fin structures 20 are exposed, respectively. The sidewall spacers 45 are not removed in some embodiments.

The ILD layer 50 protects the S/D regions of the fin structures 20 during the removal of the dummy gate structures 40. The dummy gate structures 40 can be removed using plasma dry etching and/or wet etching. When the dummy gate electrode layer is polysilicon and the ILD layer 50 is silicon oxide, a wet etchant such as a tetramethylammonium hydroxide (TMAH) solution can be used to selectively remove the dummy gate electrode layer. The dummy gate dielectric layer is thereafter removed using plasma dry etching and/or wet etching.

Figure 9B:
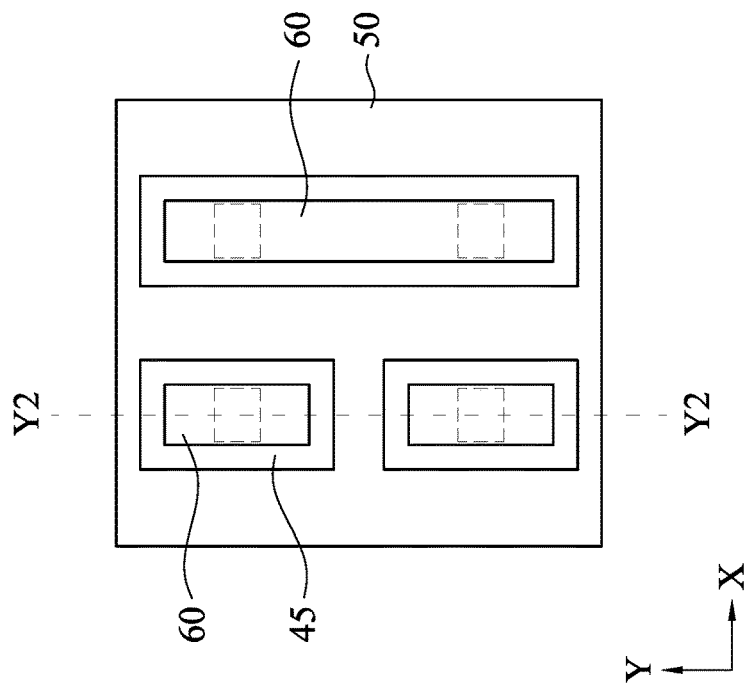
FIGS. 9A and 9B show one of the various stages of sequential processes for manufacturing a semiconductor device according to an embodiment of the present disclosure.
Figure 9A:
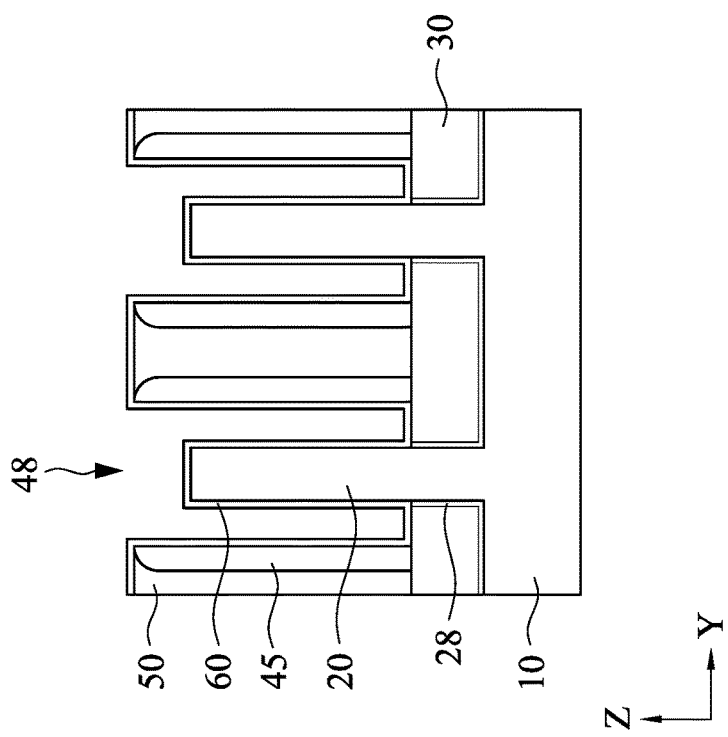

FIGS. 9A and 9B show one of the various stages of sequential processes for manufacturing a semiconductor device having FinFETs with a flat-top source/drain epitaxial layer according to an embodiment of the present disclosure. FIG. 9A is a cross sectional view corresponding to line Y2-Y2 of FIG. 9B.

Then, a gate dielectric layer 60 is formed over the exposed fin structures 20, which are channel regions, and the surrounding areas, as shown in FIGS. 9A and 9B. In certain embodiments, the gate dielectric layer 60 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 60 includes an interfacial layer formed between the channel layers and the dielectric material, by using chemical oxidation.

The gate dielectric layer 60 may be formed by CVD, ALD or any suitable method. In one embodiment, the gate dielectric layer 60 is formed using a highly conformal deposition process such as ALD in order to ensure the formation of a gate dielectric layer having a uniform thickness around each channel layers. The thickness of the gate dielectric layer 60 is in a range from about 1 nm to about 6 nm in one embodiment.

Figure 10B:
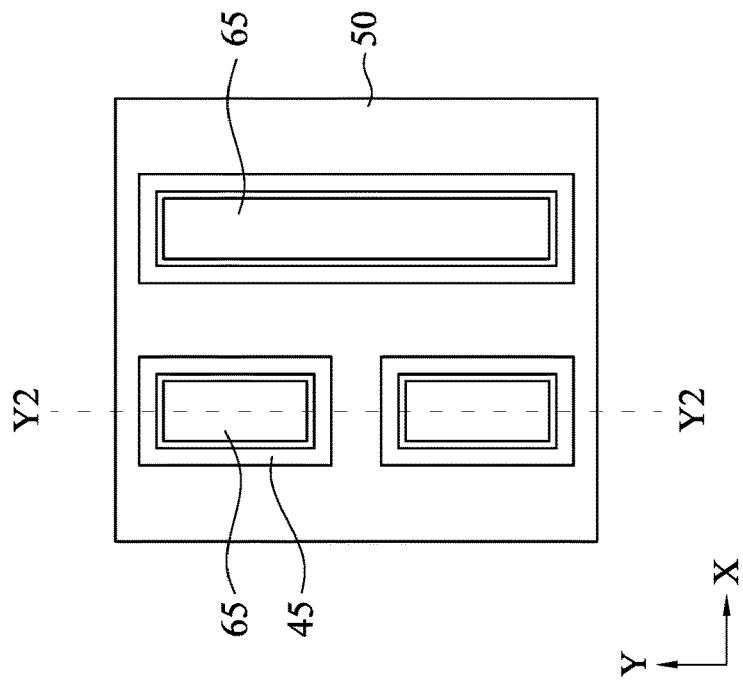
FIGS. 10A and 10B one of the various stages of sequential processes for manufacturing a semiconductor device according to an embodiment of the present disclosure.
Figure 10A:
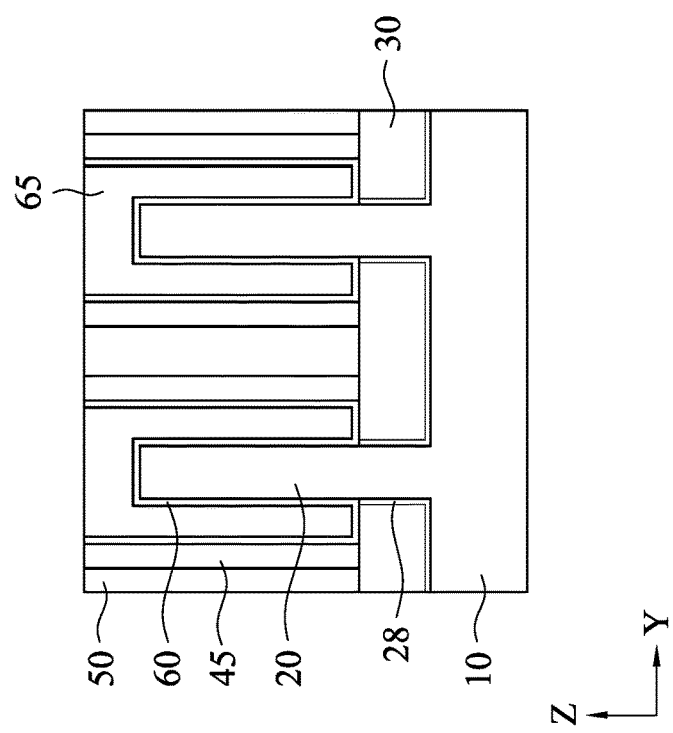
Figure 11B:
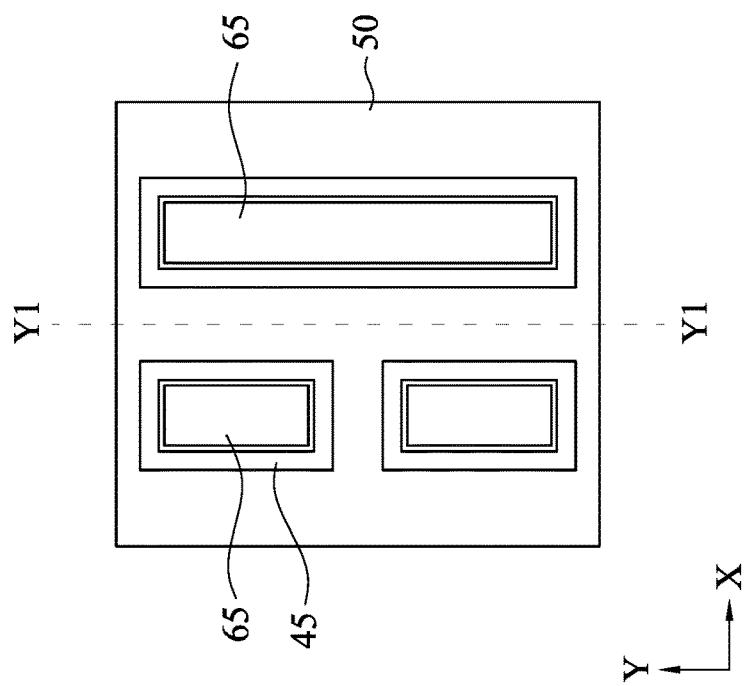
FIGS. 11A and 11B show one of the various stages of sequential processes for manufacturing a semiconductor device according to an embodiment of the present disclosure.
Figure 11A:
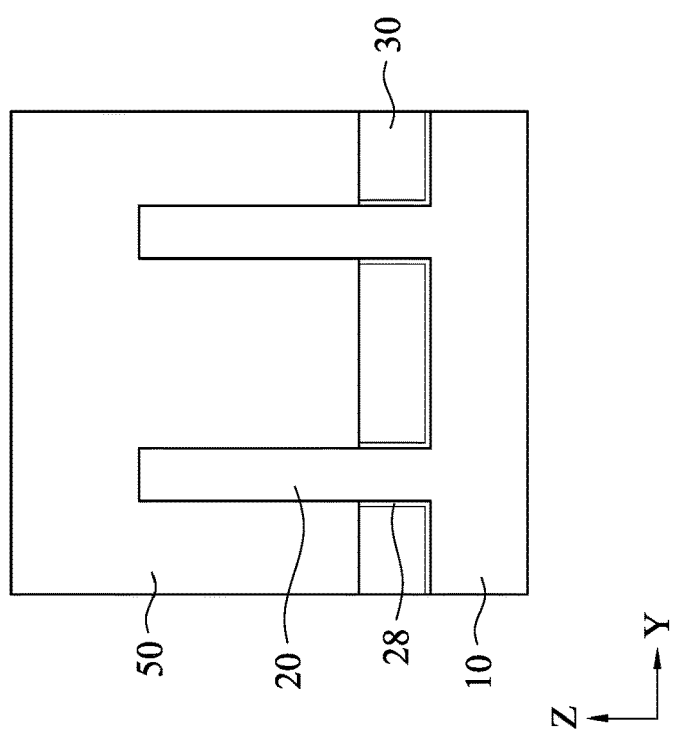

FIGS. 10A and 10B and FIGS. 11A and 11BB show one of the various stages of sequential processes for manufacturing a semiconductor device having FinFETs with a flat-top source/drain epitaxial layer according to an embodiment of the present disclosure. FIG. 10A is a cross sectional view corresponding to line Y2-Y2 of FIG. 10B. FIG. 11A is a cross sectional view corresponding to line Y1-Y1 of FIG. 11B.

Subsequently, a gate electrode layer 65 is formed on the gate dielectric layer 60. The gate electrode layer 65 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 65 may be formed by CVD, ALD, electro-plating, or other suitable method. The gate dielectric layer 60 and the electrode layer 65 are also deposited over the upper surface of the ILD layer 50. The gate dielectric layer and the gate electrode layer formed over the ILD layer 50 are then planarized by using, for example, CMP, until the top surface of the ILD layer 50 is revealed, as shown in FIG. 10A.

In certain embodiments of the present disclosure, one or more work function adjustment layers (not shown) are interposed between the gate dielectric layer 60 and the gate electrode layer 65. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

FIG. 11A shows the source/drain regions of the fin structures 20 after the gate electrode layer 65 is formed. As shown in FIG. 11A, the source/drain regions of the fin structures 20 are covered by the ILD layer 50.

Figure 12B:
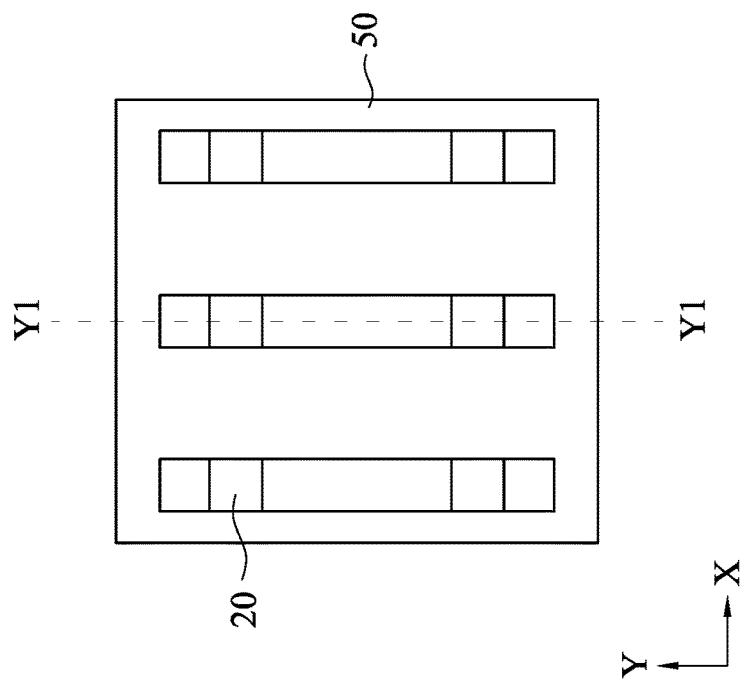
FIGS. 12A and 12B show one of the various stages of sequential processes for manufacturing a semiconductor device according to an embodiment of the present disclosure.
Figure 12A:
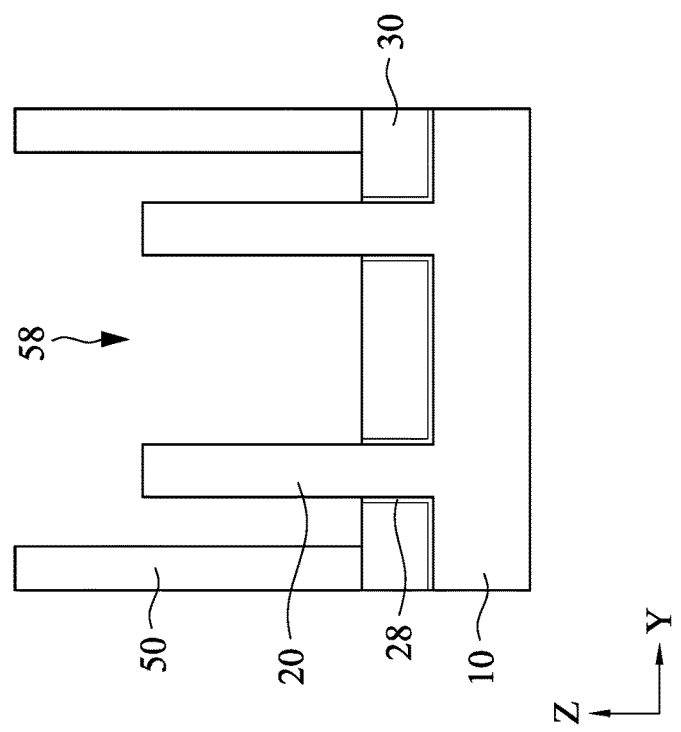

FIGS. 12A and 12B show one of the various stages of sequential processes for manufacturing a semiconductor device having FinFETs with a flat-top source/drain epitaxial layer according to an embodiment of the present disclosure. FIG. 12A is a cross sectional view corresponding to line Y1-Y1 of FIG. 12B.

As shown in FIGS. 12A and 12B, the ILD layer 50 is patterned by one or more lithography and etching operations, thereby forming a source/drain opening 58. In the source/drain opening 58, the source/drain regions of the fin structure 20 are exposed.

In some embodiments, the source/drain regions of the fin structure 20 are doped with appropriate dopants before or after the source/drain opening 58 is formed. In FIGS. 12A and 12B, one source/drain opening 58 is formed to expose two fin structures 20. However, the configuration is not limited to this. In some embodiments, one source/drain opening 58 is formed over only one fin structure, and in other embodiments, one source/drain opening 58 is formed over three or more fin structures.

Figure 13B:
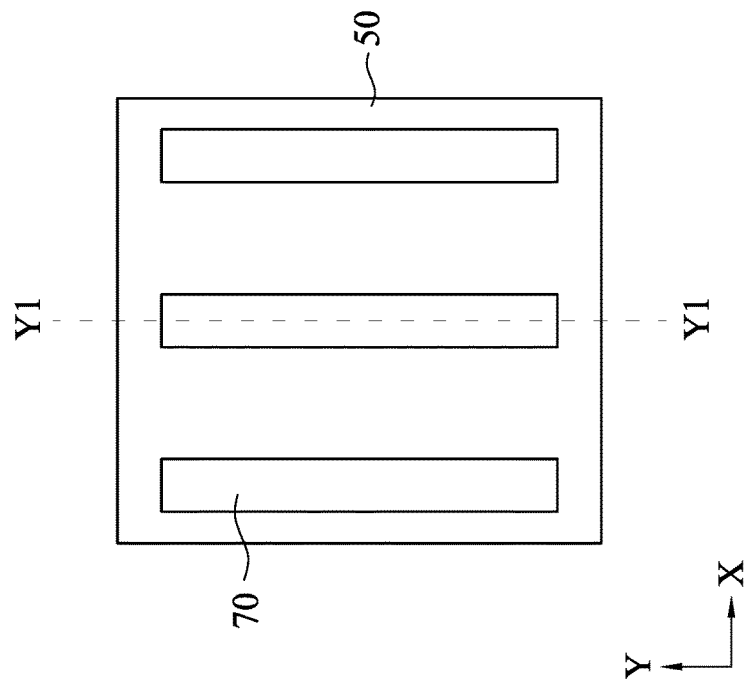
FIGS. 13A and 13B show one of the various stages of sequential processes for manufacturing a semiconductor device according to an embodiment of the present disclosure.
Figure 13A:
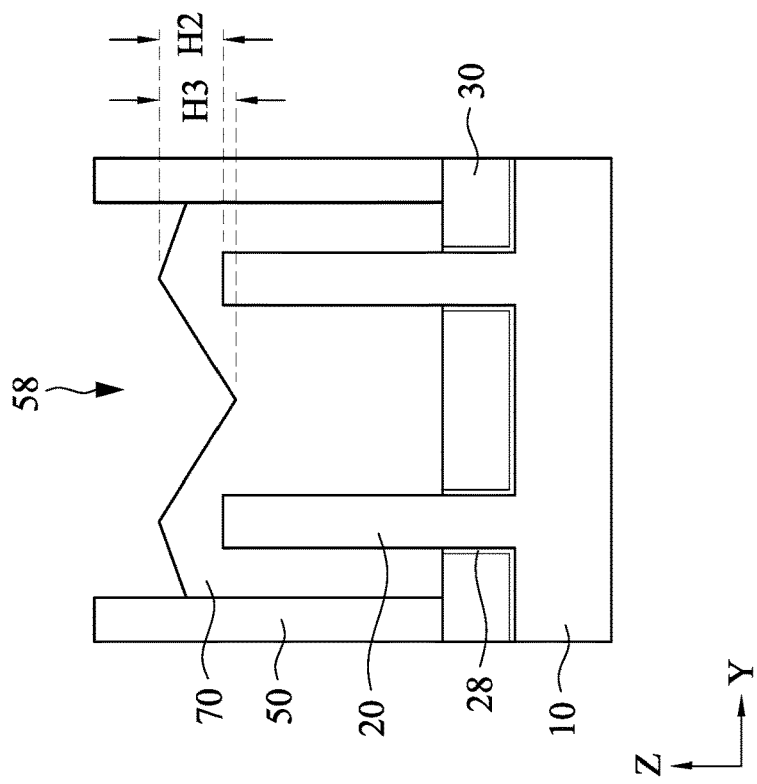

FIGS. 13A and 13B show one of the various stages of sequential processes for manufacturing a semiconductor device having FinFETs with a flat-top source/drain epitaxial layer according to an embodiment of the present disclosure. FIG. 13A is a cross sectional view corresponding to line Y1-Y1 of FIG. 13B.

After the source/drain opening 58 is formed and the source/drain regions of the fin structures 20 are exposed, one or more source/drain epitaxial semiconductor layers 70 are formed over the fin structures 20 as shown in FIGS. 13A and 13B. In some embodiments, the source/drain epitaxial layer 70 includes Ge doped with phosphorous (Ge:P) or $Si_{1-x}Ge_x$ doped with P (SiGe:P), where $0.3<x<1$, for n-type FETs. In certain embodiments, $0.3<x$, or $0.5<x<0.8$.

In some embodiments, an amount of P in the Ge:P layer or the SiGe:P layer is in a range from about $1\times10^{19}$ atoms/$cm^3$ to $1\times10^{20}$ atoms/$cm^3$. In other embodiments, the amount of P is in a range from about $2\times10^{19}$ atoms/$cm^3$ to $8\times10^{19}$ atoms/$cm^3$. In other embodiments, boron (B) is doped for p-type FETs, in a range from about $1\times10^{19}$ atoms/$cm^3$ to $1\times10^{20}$ atoms/$cm^3$, or in a range from about $2\times10^{19}$ atoms/$cm^3$ to $8\times10^{19}$ atoms/$cm^3$.

The Ge:P layer can be epitaxially formed on the source/drain regions of the fin structures 20 by using a metal-organic CVD (MOCVD), molecular beam epitaxy (MBE), ALD or any other film formation methods. In some embodiments, a $Ge_2H_6$ gas is used as a source gas of Ge. In some embodiments, a $Si_2H_6$ gas is used as a source gas of Si. In certain embodiments, instead of or, in addition to, $Ge_2H_6$ and/or $Si_2H_6$, $GeH_4$ and/or $SiH_4$ is used. One or more inert gas, such as $H_2$, He, Ar and/or $N_2$, is used as a dilution gas.

During the epitaxial formation of the Ge:P layer or the SiGe:P layer, a substrate temperature is maintained at a range from about 350° C. to about 410° C. in some embodiments. The substrate temperature is a temperature of a hot plate or a wafer holder/stage. In other embodiments, the substrate temperature is in a range from about 380° C. to about 400° C. When a $Ge_2H_6$ gas and/or a $Si_2H_6$ gas is used, it is possible to epitaxially form the Ge or SiGe layer 70 at a relatively low temperature of less than about 400° C. The source/drain epitaxial layer 70 can be selectively formed from the semiconductor fin structures 20, and is not formed on the upper surface of the ILD layer 50. A doping gas is $PH_3$ for phosphorous, $AsH_3$ for arsenic or $B_2H_6$ for boron.

The source/drain epitaxial layer 70 is formed such that a thickness H2 of the source/drain epitaxial layer 70 above the fin structures is in a range from about 10 nm to about 100 nm in some embodiments, and is in a range from about 20 nm to about 60 nm in other embodiments. As shown in FIG. 13A, the source/drain epitaxial layer 70 as deposited has an uneven surface. In some embodiments, the source/drain epitaxial layer 70 has a highest portion and a lowest portion measured from the substrate 10, and the difference between the highest portion and the lowest portion H3 is in a range from about from about 10 nm to about 100 nm in some embodiments, and is in a range from about 20 nm to about 60 nm in other embodiments. The lowest portion is located between the two fin structures in some embodiments, and is located at the interface between the source/drain epitaxial layer 70 and the ILD layer 50 in other embodiments. Further, as shown in FIG. 13A, no void is formed in the source/drain opening 58 between the source/drain epitaxial layer 70 and the isolation insulating layer 30 and between the source/drain epitaxial layer 70 and the ILD layer 50.

Figure 14B:
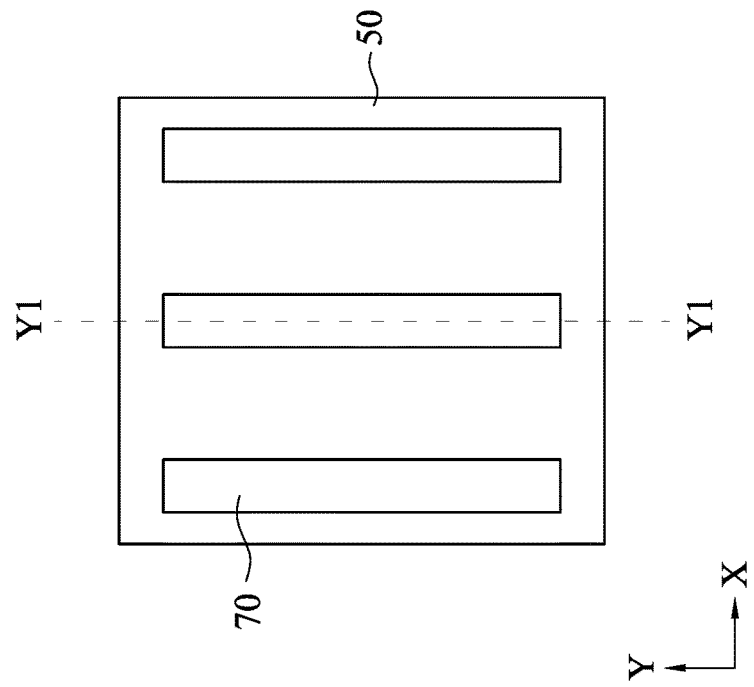
FIGS. 14A, 14B, 14C and 14D show one of the various stages of sequential processes for manufacturing a semiconductor device according to an embodiment of the present disclosure.
Figure 14A:
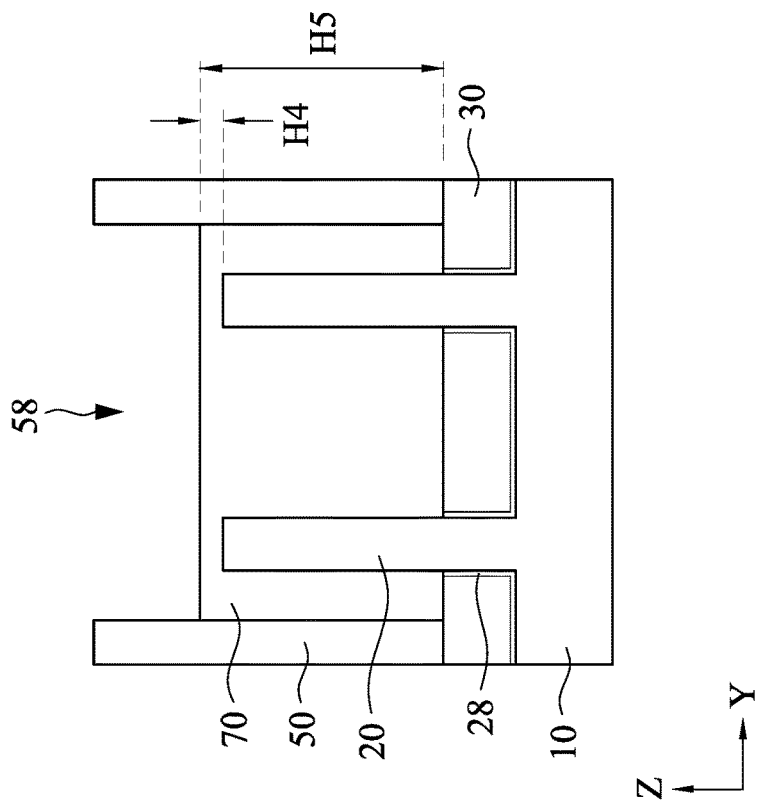

FIGS. 14A and 14B show one of the various stages of sequential processes for manufacturing a semiconductor device having FinFETs with a flat-top source/drain epitaxial layer according to an embodiment of the present disclosure. FIG. 14A is a cross sectional view corresponding to line Y1-Y1 of FIG. 14B.

After the source/drain epitaxial layer 70 is formed, a thermal annealing operation is optionally performed to flatten the surface of the source/drain epitaxial layer 70, as shown in FIGS. 14A and 14B. The annealing operation is performed by heating the substrate at a temperature in a range from about 410° C. to about 470° C. in some embodiment, and in a range from about 440° C. to about 460° C. in other embodiments. The annealing operation is performed for a time duration in a range from about 100 sec to about 500 sec in some embodiments, and in a range from about 250 sec to 350 sec in other embodiments. In some embodiments, the annealing operation is performed in the same manufacturing apparatus, in particular, in the same process chamber as the process of forming the source/drain epitaxial layer 70. In certain embodiments, after the process gas(es) for the epitaxial growth is/are stopped, and then the substrate temperature is increased to the annealing temperature. Thus, the annealing operation is performed without exposing the substrate (the source/drain epitaxial layer) to the atmosphere, in particular to an oxygen containing atmosphere. In some embodiments, during the annealing operation, an inert gas, such as $H_2$, He, Ar and/or $N_2$, is supplied. By the annealing operation, the upper surface of the source/drain epitaxial layer 70 becomes substantially flat. In other embodiments, a planarization operation, such as an etch-back operation or a chemical mechanical polishing operation, is employed to flatten the upper surface of the source/drain epitaxial layer 70.

In certain embodiments, a laser annealing operation is performed to flatten the source/drain epitaxial layer 70. In such a case, a laser beam is selectively applied only to the source/drain area avoiding the gate structure. In some embodiments, the source/drain epitaxial layer is heated to about 800° C. to about 1000° C. in some embodiments. The time duration of applying the laser to the source/drain region is in a range from about 0.1 nsec to 1000 nsec in some embodiments, and is in a range from about 1 nsec to 100 nsec in other embodiments.

In some embodiments, the distance H4 between the top of the fin structure 20 and the upper surface of the source/drain epitaxial layer 70 is in a range from about 5 nm to about 90 nm in some embodiments, and is in a range from about 10 nm to about 50 nm in other embodiments. The thickness H5 of the source/drain epitaxial layer 70 from the upper surface of the isolation insulating layer 30 is in a range from about 55 nm to about 190 nm in some embodiments, and is in a range from about 70 nm to about 130 nm in other embodiments.

Figure 14C:
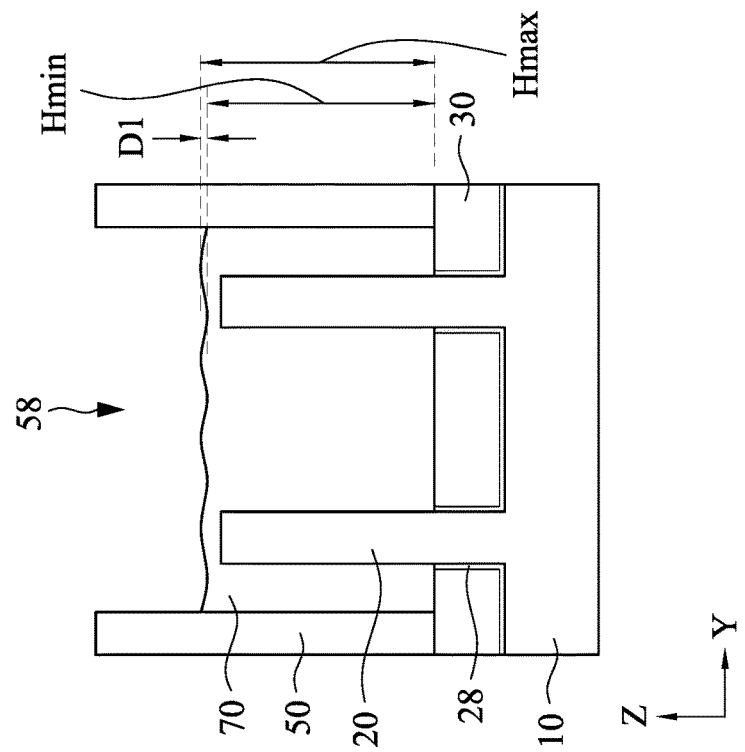
Figure 14D:
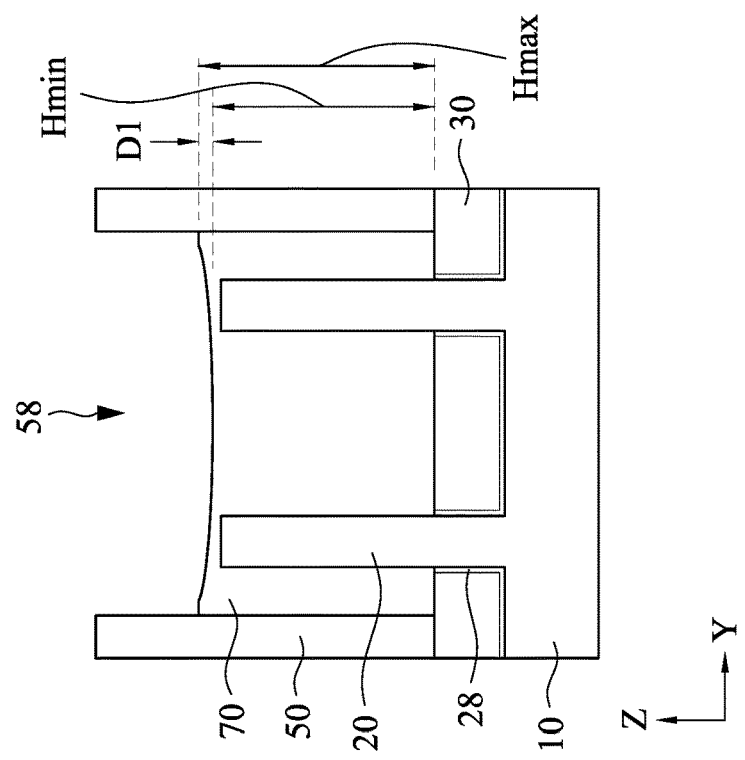

In some embodiments, the upper surface of the source/drain epitaxial layer 70 is not completely flat. As shown in FIGS. 14C and 14D, the thickness (flatness) variation D1, which is the difference between the maximum thickness Hmax and the minimum thickness Hmin of the source/drain epitaxial layer 70, is less than about 5 nm in some embodiments. In certain embodiments, the variation D1 is more than 0 nm or more than about 0.2 nm. In other embodiment, the variation D1 is in a range from about 0.3 nm to about 3 nm. In some embodiments, the upper surface of the source/drain epitaxial layer has a convex shape, as shown in FIG. 14C, and the maximum thickness is located at the interface between the source/drain epitaxial layer and the ILD layer 50. In certain embodiments, the minimum thickness is located between the two fin structures or at the other interface between the source/drain epitaxial layer and the ILD layer 50. In other embodiments, the upper surface of the source/drain epitaxial layer 70 has a wavy shape, as shown in FIG. 14D. In some embodiments, by adjusting epitaxial growth conditions, the upper surface of the source/drain epitaxial layer 70 is made flat without an additional heating operation as set forth above.

Figure 15B:
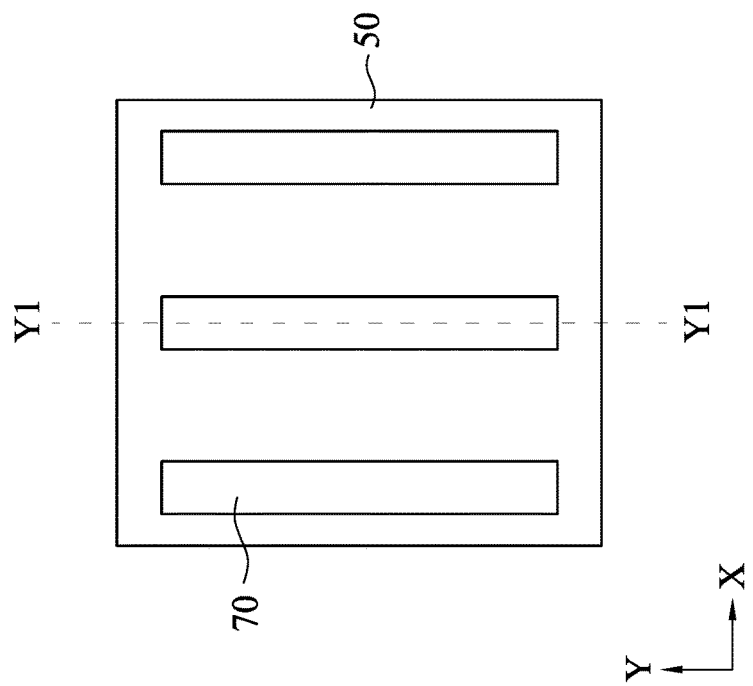
FIGS. 15A and 15B show one of the various stages of sequential processes for manufacturing a semiconductor device according to an embodiment of the present disclosure.
Figure 15A:
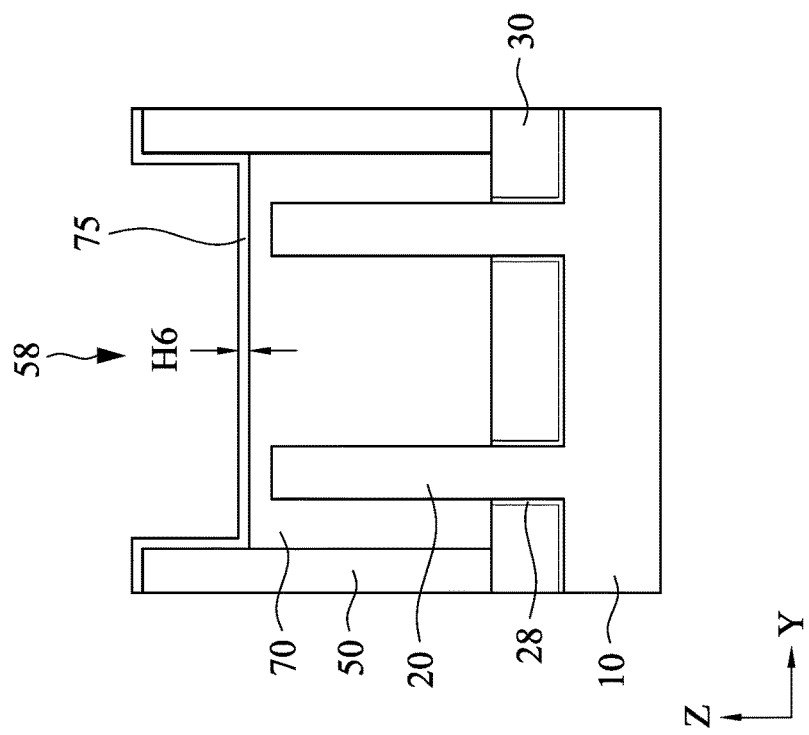

FIGS. 15A and 15B show one of the various stages of sequential processes for manufacturing a semiconductor device having FinFETs with a flat-top source/drain epitaxial layer according to an embodiment of the present disclosure. FIG. 15A is a cross sectional view corresponding to line Y1-Y1 of FIG. 15B.

After the heating (annealing) process, an interfacial layer 75 is formed over the source/drain epitaxial layer 70, as shown in FIGS. 15A and 15B. In some embodiments, the interfacial layer 75 is made of a semiconductor material. The semiconductor material for the interfacial layer includes Si or $Si_{1-y}Ge_y$, where $0<y<0.3$. In some embodiments, phosphorous (P) and/or arsenic (As) is doped in the semiconductor interfacial layer 75. In other embodiments, boron (B) is doped. The doping amount in the interfacial semiconductor layer 75 is in a range from about $1\times10^{20}$ atoms/cm$^3$ to $1\times10^{21}$ atoms/cm$^3$ in some embodiments, and is in a range from about $2\times10^{20}$ atoms/cm$^3$ to $8\times10^{20}$ atoms/cm$^3$ in other embodiments. In certain embodiments, Si doped with P is used as the interfacial semiconductor layer 75. In some embodiments, the interfacial semiconductor layer 75 is non-single crystalline, and is amorphous and/or poly crystalline.

The interfacial semiconductor layer 75 can be formed on the source/drain epitaxial layer 70 by using a metal-organic CVD (MOCVD), ALD or any other film formation methods. In some embodiments, one or more of $SiH_4$, $Si_2H_6$, $Si_3H_8$, $Si_4H_{10}$, $GeH_4$ and $Ge_2H_6$ are used as a source gas. In certain embodiments, $Si_3H_8$ and $PH_3$ are used to form a Si:P layer. During the epitaxial formation of the interfacial semiconductor layer 75, a substrate temperature is maintained at a range from about 410° C. to about 470° C. in some embodiments. In other embodiments, the substrate temperature is in a range from about 440° C. to about 460° C. In certain embodiments, the substrate temperature for forming the interfacial semiconductor layer 75 is the same or substantially the same as that in the annealing operation. In other embodiments, a change in the substrate temperature between the annealing operation and the formation of the interfacial layer is within ±10° C. (substantially the same).

The thickness H6 of the interfacial semiconductor layer 75 is in a range from about 5 nm to about 50 nm in some embodiments, and is in a range from about 10 nm to 30 nm in other embodiments. As shown in FIG. 15A, in some embodiments, the interfacial semiconductor layer 75 is also formed on the ILD layer 50. In other words, the interfacial semiconductor layer 75 is conformally formed.

In some embodiments, the formation of the interfacial layer 75 is performed in the same manufacturing apparatus, in particular, in the same process chamber as the annealing operation. In certain embodiments, after the intended annealing time passes, the process gas for the interfacial layer 75 is supplied. Thus, the formation of the interfacial layer 75 is performed without exposing the substrate (the flattened source/drain epitaxial layer) to the atmosphere, in particular to an oxygen containing atmosphere.

Figure 16B:
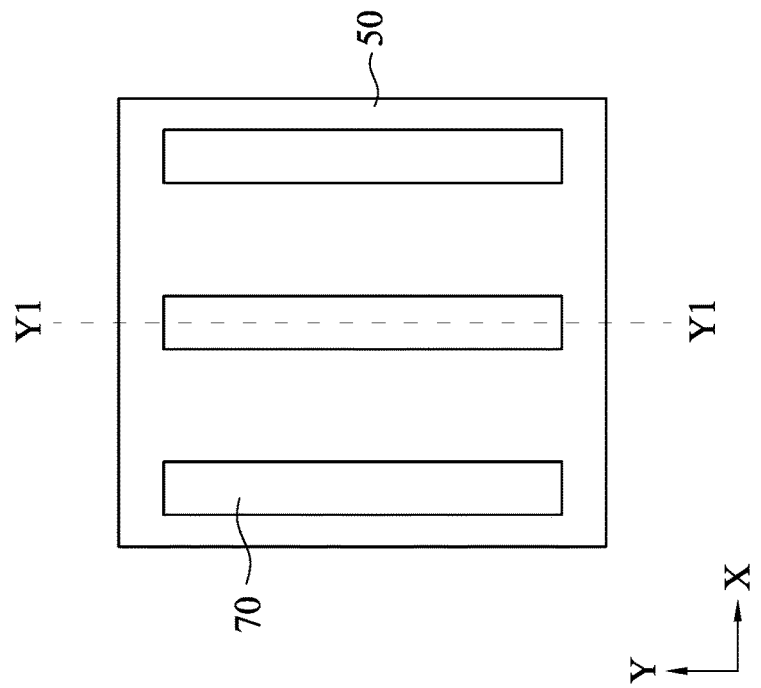
FIGS. 16A and 16B show one of the various stages of sequential processes for manufacturing a semiconductor device according to an embodiment of the present disclosure.
Figure 16A:
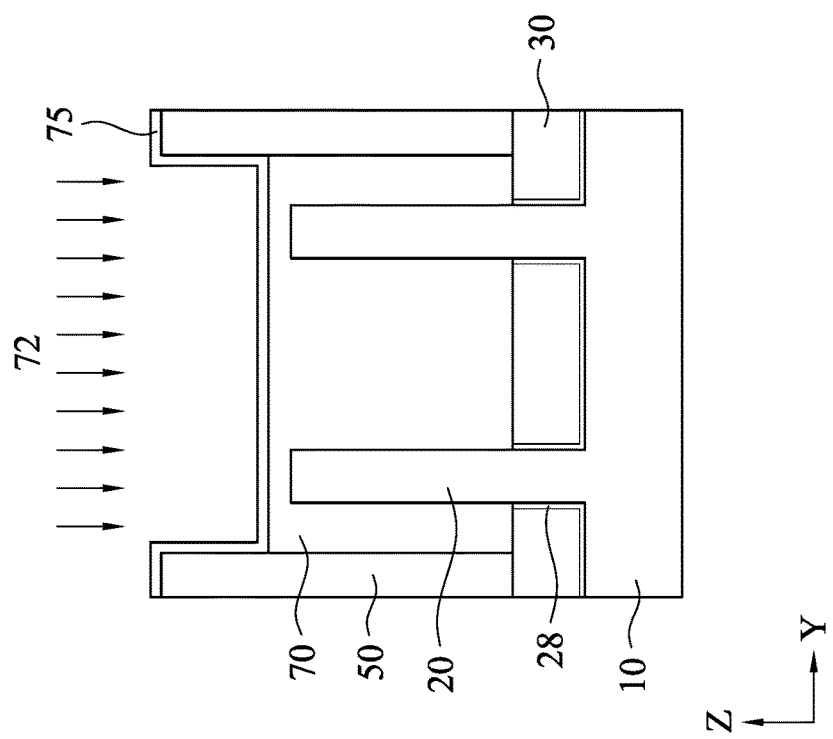

FIGS. 16A and 16B show one of the various stages of sequential processes for manufacturing a semiconductor device having FinFETs with a flat-top source/drain epitaxial layer according to an embodiment of the present disclosure. FIG. 16A is a cross sectional view corresponding to line Y1-Y1 of FIG. 16B.

In some embodiments, an ion implantation operation 72 is performed to implant additional dopant to the source/drain epitaxial layer 70, as shown in FIGS. 16A and 16B. In some embodiments, P and/or As are implanted. In other embodiments, B ($BF_2$) is implanted. In some embodiments, a laser annealing operation is performed to activate the dopants (doped impurities) in the source/drain epitaxial layer 70. In such a case, a laser beam is selectively applied only to the source/drain area, avoiding the gate structure. In some embodiments, the source/drain epitaxial layer is heated to about 800° C. to about 1000° C. in some embodiments. The laser annealing may be performed without performing the ion implantation operation 72.

Figure 17B:
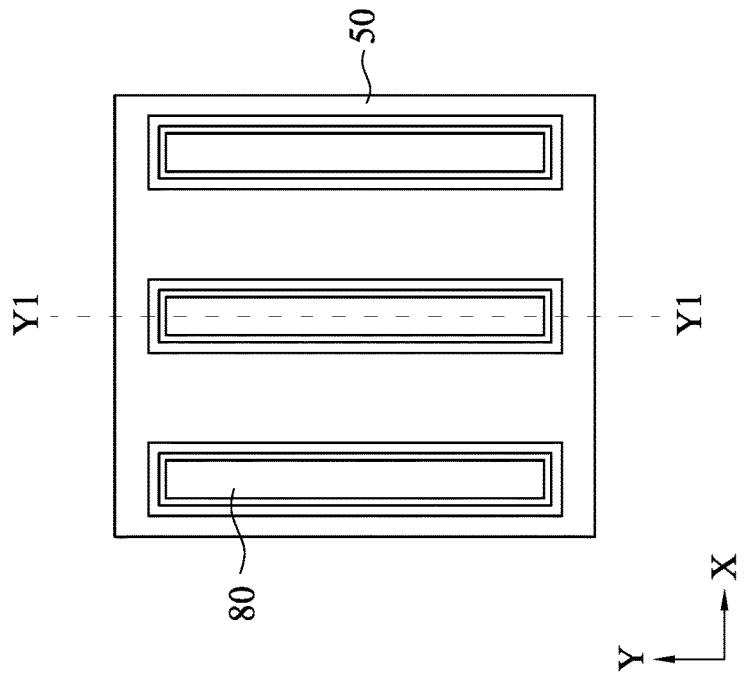
FIGS. 17A and 17B show one of the various stages of sequential processes for manufacturing a semiconductor device according to an embodiment of the present disclosure.
Figure 17A:
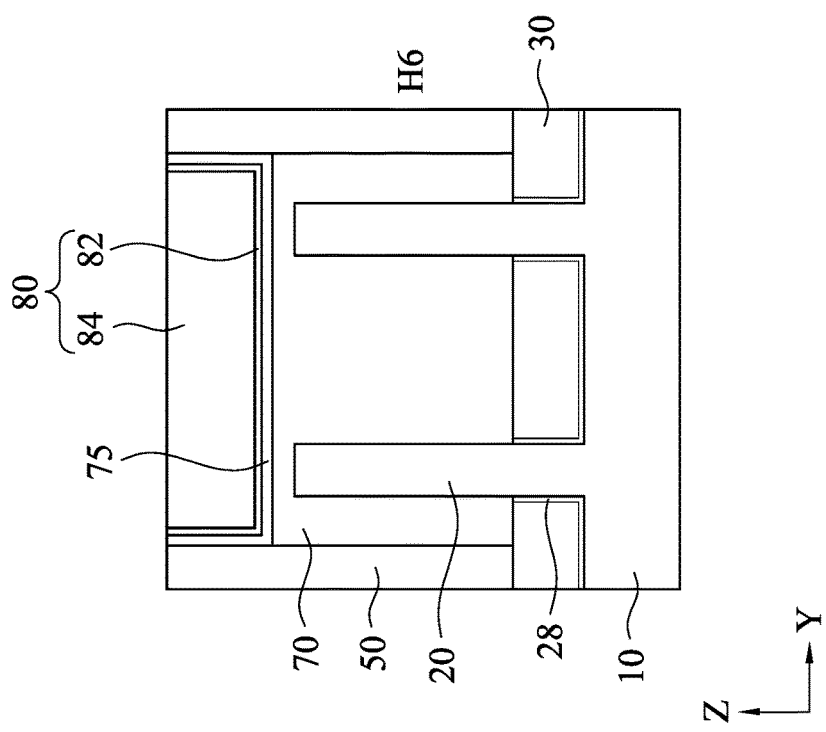

FIGS. 17A and 17B show one of the various stages of sequential processes for manufacturing a semiconductor device having FinFETs with a flat-top source/drain epitaxial layer according to an embodiment of the present disclosure. FIG. 17A is a cross sectional view corresponding to line Y1-Y1 of FIG. 17B.

After the interfacial layer 75 is formed, a conductive contact 80 is formed, as shown in FIGS. 17A and 17B. One or more layers of conductive materials are formed in the remaining portion of the contact opening 58. One or more layers of conductive materials are formed in and over the contact openings and then a planarization operation, such as a CMP operation, is performed to form contact 80, as shown in FIGS. 17A and 17B. In some embodiments, the contact 80 includes a liner layer 82 and a body layer 82. The liner layer is a barrier layer and/or a glue (adhesion) layer. In some embodiments, a Ti layer is formed on the interfacial layer 75 and a TiN or TaN layer is formed on the Ti layer, as the liner layer 82. The body layer 84 includes one or more layers of Co, Ni, W, Ti, Ta, Cu and Al, or any other suitable material.

As shown in FIGS. 17A and 17B, the conductive contact 80 is in contact with only the upper surface of the source/drain epitaxial layer 70 via the interfacial semiconductor layer 75, and thus does not form a wrap-around contact structure in which side faces of a source/drain region and/or a source/drain epitaxial layer are covered by the conductive contact. The ILD layer 50 has a contact opening (58), and a lower portion of the contact opening is filled by the source/drain epitaxial layer 70 and an upper portion of the contact opening is filled by the interfacial semiconductor layer 75 and the conductive contact 80. Further, no void is formed between the source/drain regions of the fin structures 20. In some embodiments, the side faces of the source/drain epitaxial layer 70 and the side faces of the conductive contact 80 are in direct contact with an inner wall of the opening of the ILD layer 50.

Figure 18B:
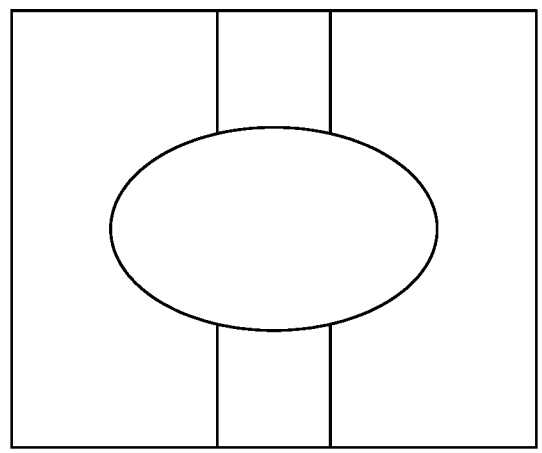
FIGS. 18A and 18B show one of the various stages of sequential processes for manufacturing a semiconductor device according to another embodiment of the present disclosure.
Figure 18A:
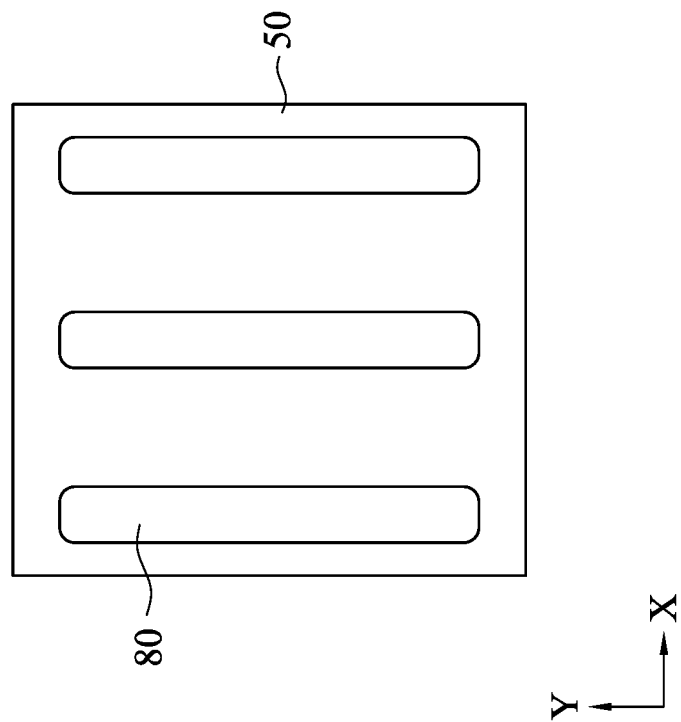

FIGS. 18A and 18B show one of the various stages of sequential processes for manufacturing a semiconductor device having FinFETs with a flat-top source/drain epitaxial layer according to another embodiment of the present disclosure. FIGS. 18A and 18B are top views after the source/drain epitaxial layer is formed.

When the contact opening 58 is formed as shown in FIGS. 12A and 12B, the shape of the contact opening in a top (plan) view has rounded corners in some embodiments as shown in FIG. 18A. In certain embodiments, when the liner side (e.g., along the Y direction) of the opening 58 is small, the shape of the opening 58 is oval as shown in FIG. 18B. Thus, the source/drain epitaxial layer 70 has a cylindrical shape with a top view being oval, circular or polygonal with round corners, into which the fin structures 20 penetrate from the bottom.

FIGS. 19A and 19B show the various stages of sequential processes for manufacturing a semiconductor device having FinFETs with a flat-top source/drain epitaxial layer according to another embodiment of the present disclosure. FIGS. 19A and 19B are cross sectional views corresponding to line Y1-Y1 of FIG. 19B.

When the contact opening 58 is formed as shown in FIGS. 12A and 12B, a part of the side faces of the ILD layer 50 forming the opening is over etched to form a concave portion 59, as shown in FIG. 19A. The concave portion 59 is formed due to a change in etching condition (e.g., gases, powers, etc) during the etching of the ILD layer 50 to form the opening 58. Depending on the timing of the change, the location of the concave portion 59 changes. In some embodiments, the concave portion 59 is formed at a level between the top of the fin structure 20 and the upper surface of the isolation insulating layer 30, as shown in FIG. 19A. In other embodiments, the concave portion 59 is formed at a level of the top of the fin structure 20, and in certain embodiments, the concave portion 59 is formed at a level higher than the top of the fin structure 20. After the source/drain epitaxial layer 70 is formed, the source/drain epitaxial layer 70 has a convex portion corresponding to the concave portion 59, as shown in FIG. 19B. The depth (maximum depth) T1 of the convex portion 59 from the side face of the opening is in a range from about 2 nm to about 30 nm in some embodiments. In some embodiments, two or more convex portions 59 are formed at different levels of one side face of the opening.

FIG. 20A shows a cross sectional view of a semiconductor device having FinFETs with a flat-top source/drain epitaxial layer according to another embodiment of the present disclosure. In this embodiment, a silicide layer 78 is formed between the interfacial semiconductor layer 75 and the contact 80. In some embodiments, the silicide layer 78 includes one or more of WSi, CoSi, NiSi, TiSi, MoSi and TaSi.

FIG. 20B shows a cross sectional view of a semiconductor device having FinFETs with a flat-top source/drain epitaxial layer according to another embodiment of the present disclosure. In this embodiment, the source/drain region 24 is made of a different material than the substrate 10. After the contact opening 58 is formed as shown in FIGS. 12A and 12B, the source/drain region of the fin structures 20 are recessed to or below the level of the upper surface of the isolation insulating layer 30. Then, by using an epitaxial growth method, a source/drain semiconductor region 24 is formed over the recessed fin structures. In some embodiments, when the substrate 10 is Si, the source/drain semiconductor region 24 is Ge or $Si_{1-z}Ge_z$, where $0.3<z<1$. In other embodiments, two or more semiconductor layers are used as the source/drain semiconductor region 24.

Figure 20D:
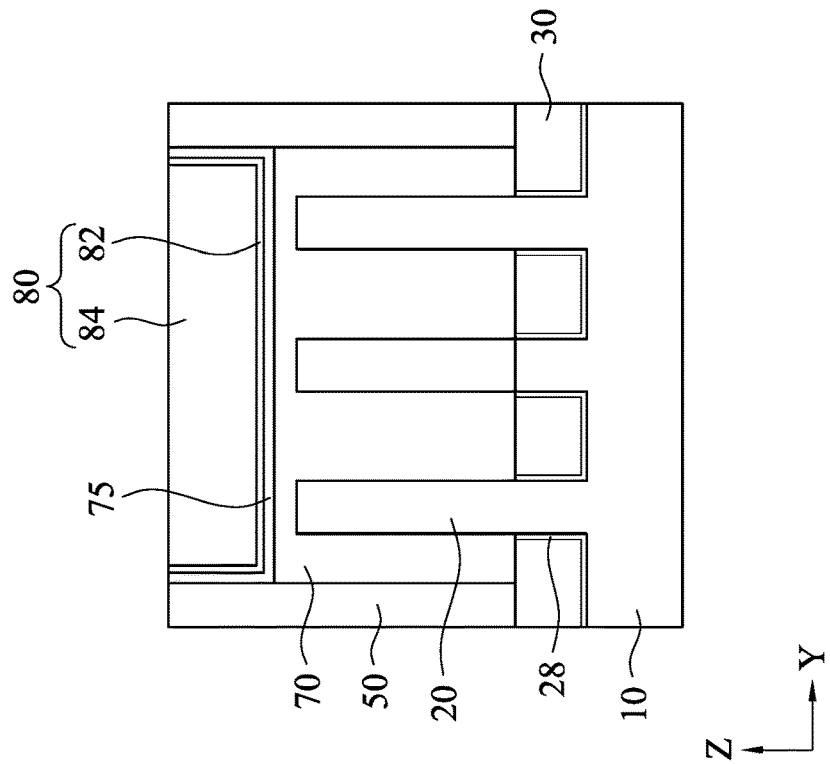
Figure 20C:
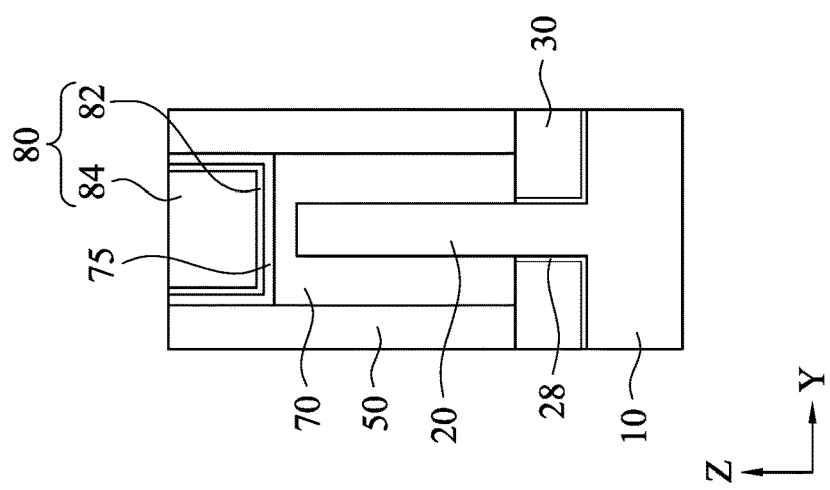

FIGS. 20C and 20D show cross sectional views of a semiconductor device having FinFETs with a flat-top source/drain epitaxial layer according to other embodiments of the present disclosure. In FIG. 20C, only one fin structure (source/drain region) 20 is disposed in the opening 58 and is covered by the source/drain epitaxial layer 70. In FIG. 20D, three fin structures (source/drain regions) 20 are disposed in the opening 58 and are covered by the source/drain epitaxial layer 70. The number of the fin structures in the opening 58 can be more than three and may be up to 10.

FIGS. 21A-24B show sequential processes for manufacturing a semiconductor device having FinFETs with a flat-top source/drain epitaxial layer according to another embodiment of the present disclosure. It is understood that additional operations can be provided before, during, and after processes shown by FIGS. 21-24B, and some of the operations described below can be replaced or eliminated, for additional embodiments of the method. The order of the operations/processes may be interchangeable.

Figure 21B:
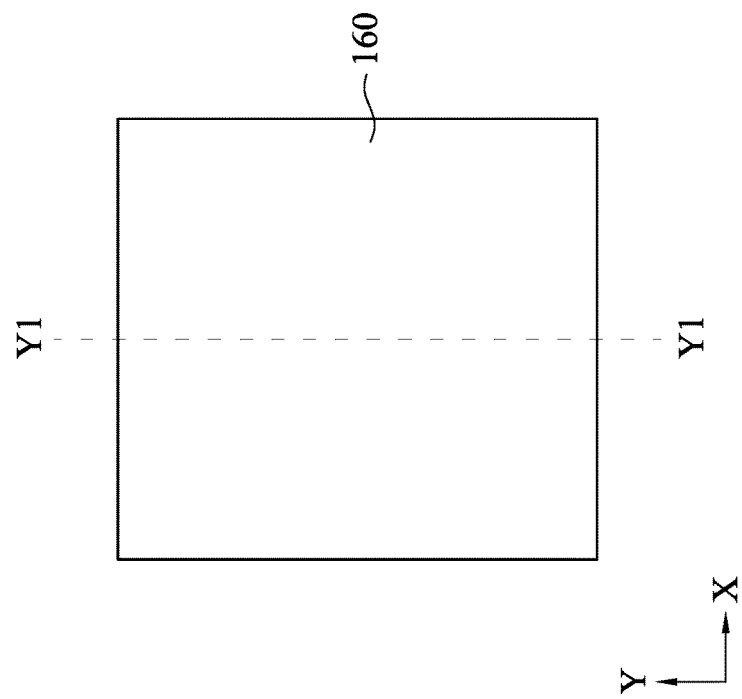
FIGS. 21A and 21B show one of the various stages of sequential processes for manufacturing a semiconductor device according to another embodiment of the present disclosure.
Figure 21A:
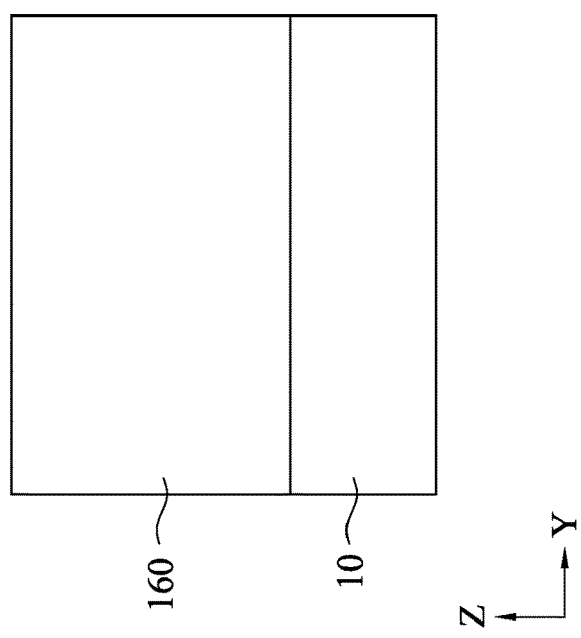

As shown in FIGS. 21A and 21B, a channel semiconductor layer 160 is epitaxially formed on the substrate 10. FIG. 21A is a cross sectional view corresponding to line Y1-Y1 of FIG. 21B. In some embodiments, the substrate 10 is Si, and the channel semiconductor layer 160 is Ge or $Si_{1-z}Ge_z$, where $0.3<z<1$. In some embodiments, a buffer semiconductor layer is formed between the substrate 10 and the channel semiconductor layer 160.

By using the similar operations explained with respect to FIGS. 2A-4B, fin structures 162 protruding from the isolation insulating layer 30 are formed, as shown in FIGS. 22A and 22B. FIG. 22A is a cross sectional view corresponding to line Y1-Y1 of FIG. 22B.

Figure 23B:
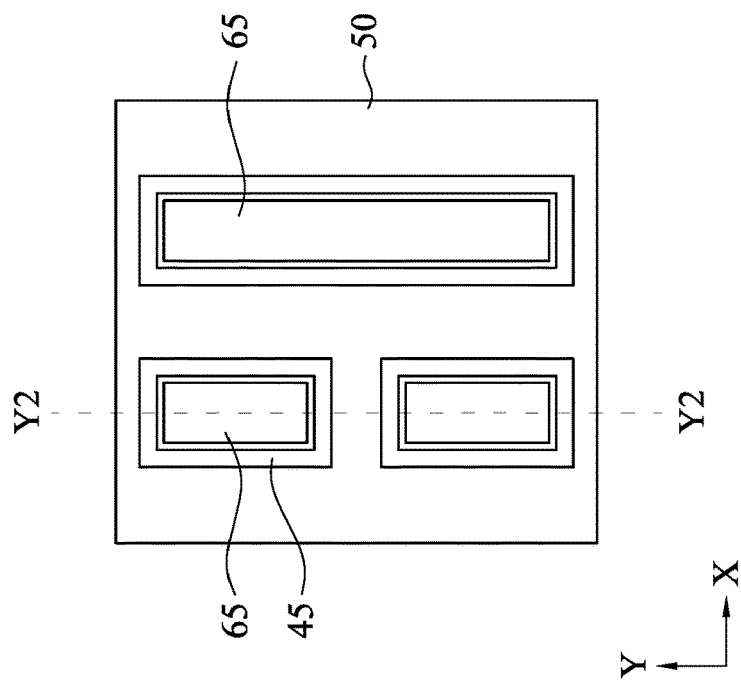
FIGS. 23A and 23B show one of the various stages of sequential processes for manufacturing a semiconductor device according to another embodiment of the present disclosure.
Figure 23A:
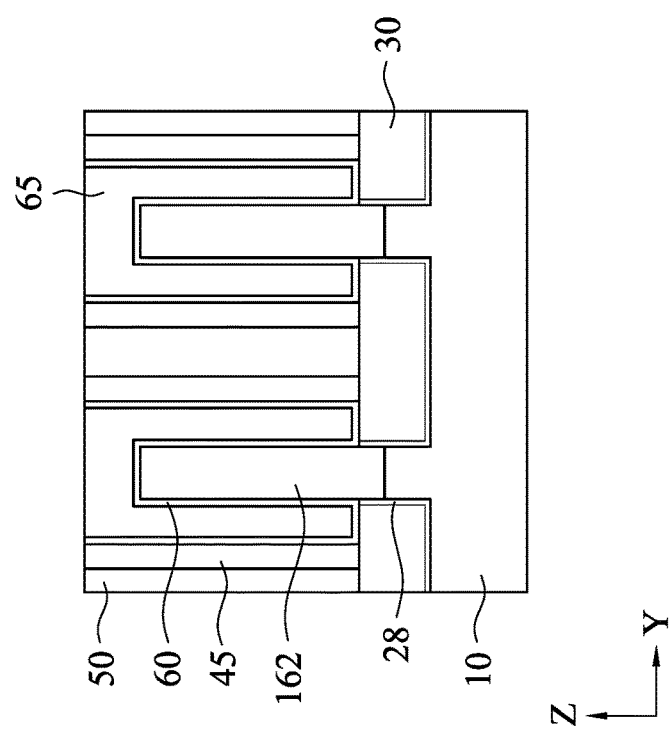

By using the similar operations explained with respect to FIGS. 5A-11B, gate structures 65 are formed, as shown in FIGS. 23A and 23B. FIG. 23A is a cross sectional view corresponding to line Y2-Y2 of FIG. 23B.

Figure 24B:
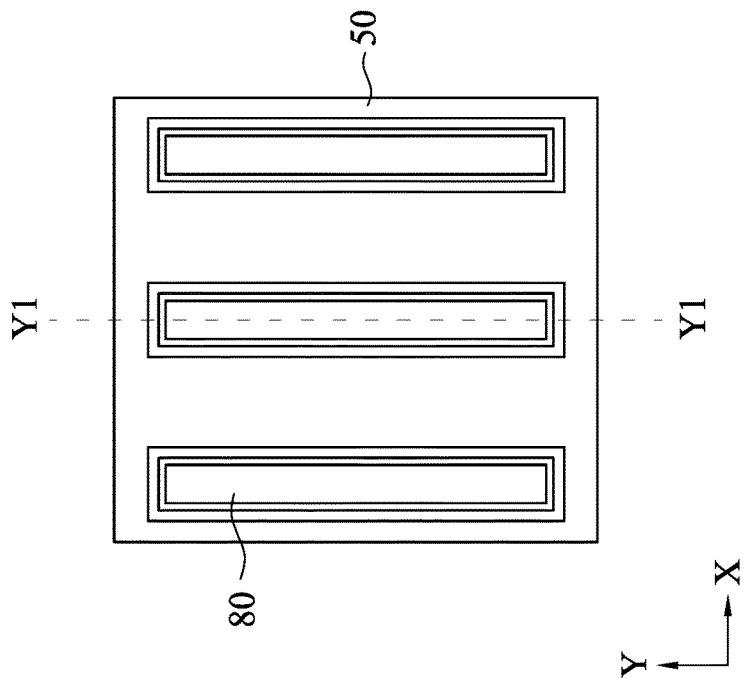
FIGS. 24A and 24B show one of the various stages of sequential processes for manufacturing a semiconductor device according to another embodiment of the present disclosure.
Figure 24A:
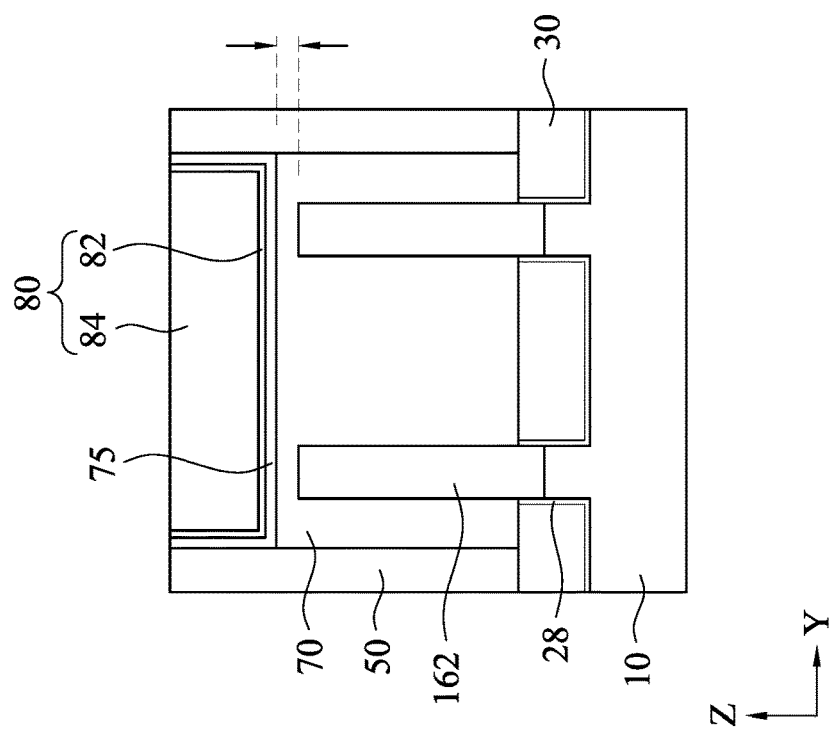

By using the similar operations explained with respect to FIGS. 12A-17B, conductive contacts 80 are formed, as shown in FIGS. 24A and 24B. FIG. 24A is a cross sectional view corresponding to line Y1-Y1 of FIG. 24B. In some embodiments, the source/drain region of the fin structure 162 is $Si_{1-z}Ge_z$, where $0.3<z<1$, and the source/drain epitaxial layer 70 is Ge or $Si_{1-x}Ge_x$, where $z<x$, doped with P and/or As.

FIGS. 25A-34B show sequential processes for manufacturing a semiconductor device having GAA FETs with a flat-top source/drain epitaxial layer according to another embodiment of the present disclosure. It is understood that additional operations can be provided before, during, and after processes shown by FIGS. 25A-34B, and some of the operations described below can be replaced or eliminated, for additional embodiments of the method. The order of the operations/processes may be interchangeable.

Figure 25B:
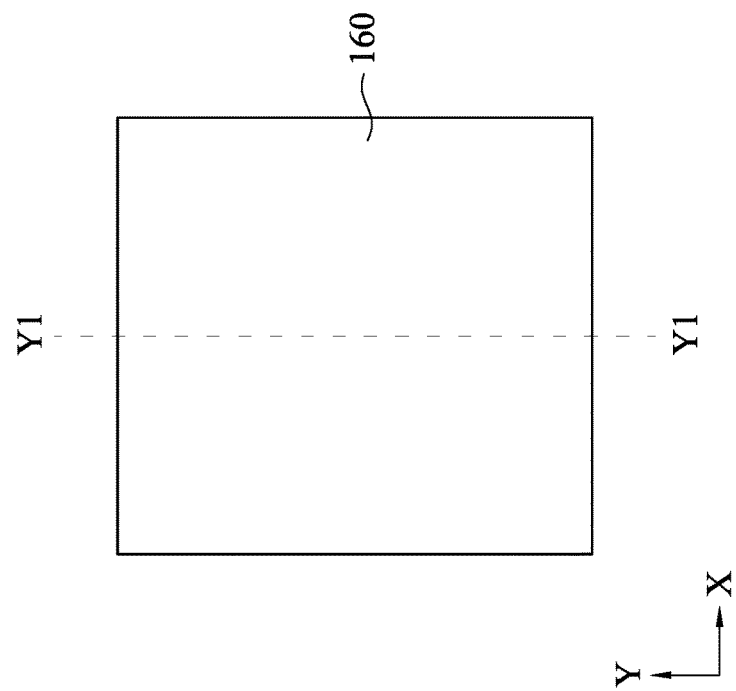
FIGS. 25A and 25B show one of the various stages of sequential processes for manufacturing a semiconductor device according to another embodiment of the present disclosure.
Figure 25A:
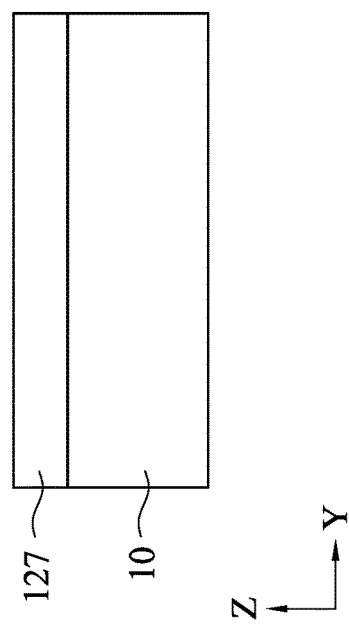

FIGS. 25A-26B show various stages of sequential processes for manufacturing a semiconductor device having a GAA FET with a flat-top source/drain epitaxial layer according to another embodiment of the present disclosure. FIGS. 25A and 26A are cross sectional views corresponding to line Y1-Y1 of FIGS. 25B and 26B.

Figure 26B:
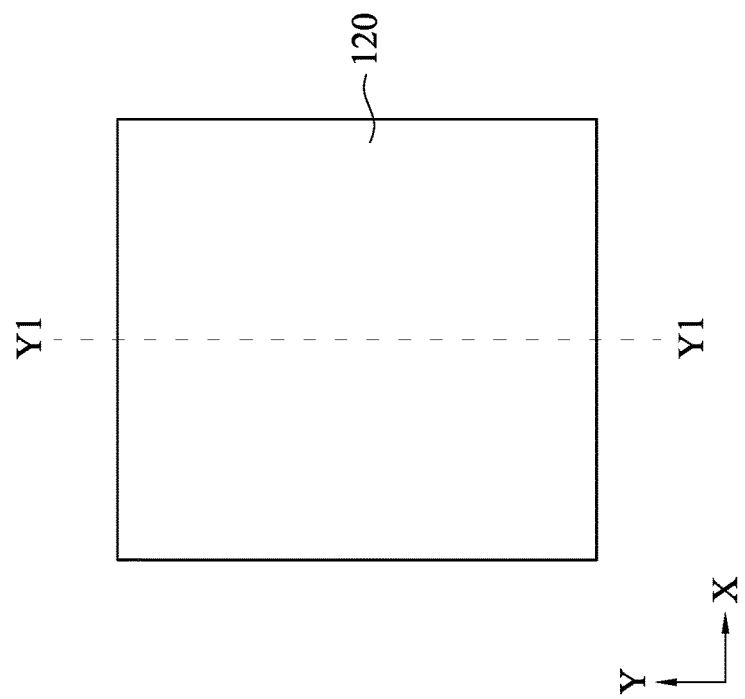
FIGS. 26A and 26B show one of the various stages of sequential processes for manufacturing a semiconductor device according to another embodiment of the present disclosure.
Figure 26A:
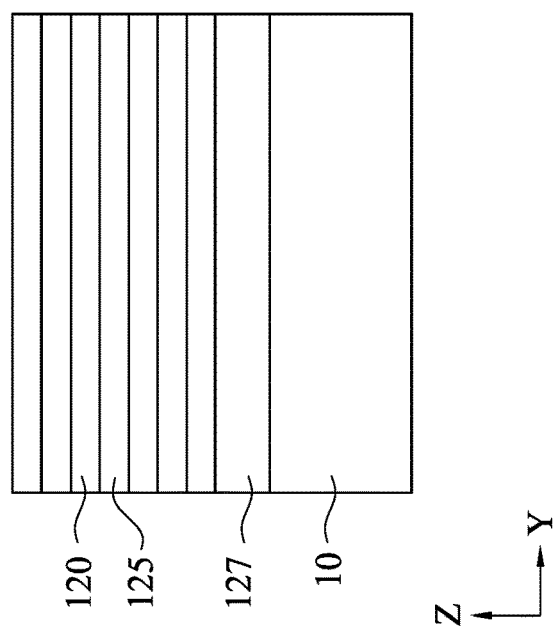

As shown in FIG. 25A, a buffer semiconductor layer 127 is formed over a substrate 10. Then, first semiconductor layers 120 and second semiconductor layer 125 are alternately stacked over the buffer layer 127 as shown in FIGS. 26A and 26B.

In some embodiments, the substrate 10 is Si, the first semiconductor layers 120 are Si, and the buffer semiconductor layer 127 and second semiconductor layer 125 are $Si_{1-z}Ge_z$, where $0.2<z<0.7$. In other embodiments, the substrate 10 is Si, the first semiconductor layers 120 are Ge or $Si_{1-x}Ge_x$, where $0.5<x<1$, and the buffer semiconductor layer 127 and second semiconductor layer 125 are $Si_{1-z}Ge_z$, where $0.2<z<0.7$ and $z<x$. In other embodiments, the semiconductor material of the buffer layer 127 and that of the second semiconductor layer are different. The buffer semiconductor layer 127, the first semiconductor layer 120 and the second semiconductor layer 125 are epitaxially formed by using CVD, MBE, ALD or any other suitable methods. In some embodiments, no buffer semiconductor layer 127 is formed.

By using the similar operations explained with respect to FIGS. 2A-4B, fin structures 121 protruding from the isolation insulating layer 30 are formed, as shown in FIGS. 27A and 27B. FIG. 27 is a cross sectional view corresponding to line Y1-Y1 of FIG. 27B.

As shown in FIG. 27A, the fin structures 121 include multiple layers of the first semiconductor layers 120 and the second semiconductor layers 125 alternately stacked. In some embodiments, the thickness of the buffer semiconductor layer 127 is greater than the thickness of each of the first semiconductor layers 120. Although FIG. 27A shows three first semiconductor layers 120 and four second semiconductor layers 125, the number of the first and second semiconductor layer can be two, three or more than four and up to ten.

Figure 28B:
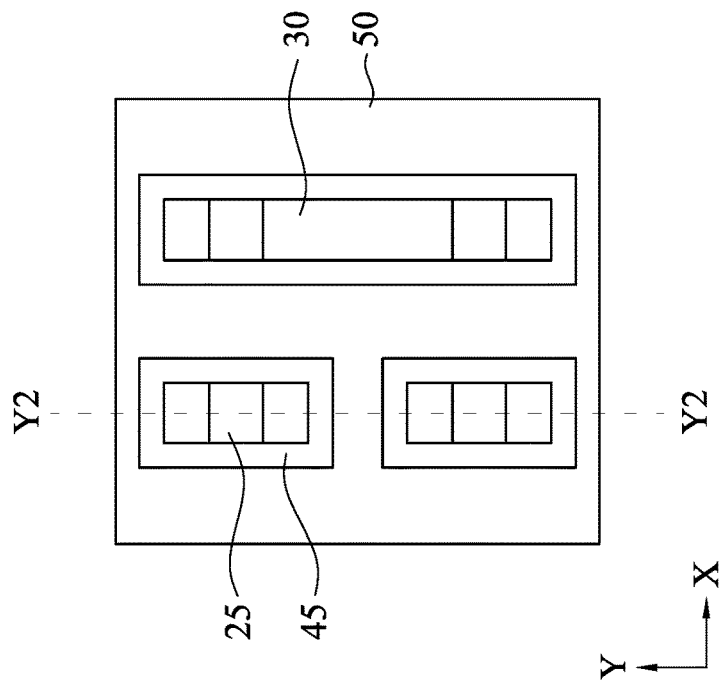
FIGS. 28A and 28B show one of the various stages of sequential processes for manufacturing a semiconductor device according to another embodiment of the present disclosure.
Figure 28A:
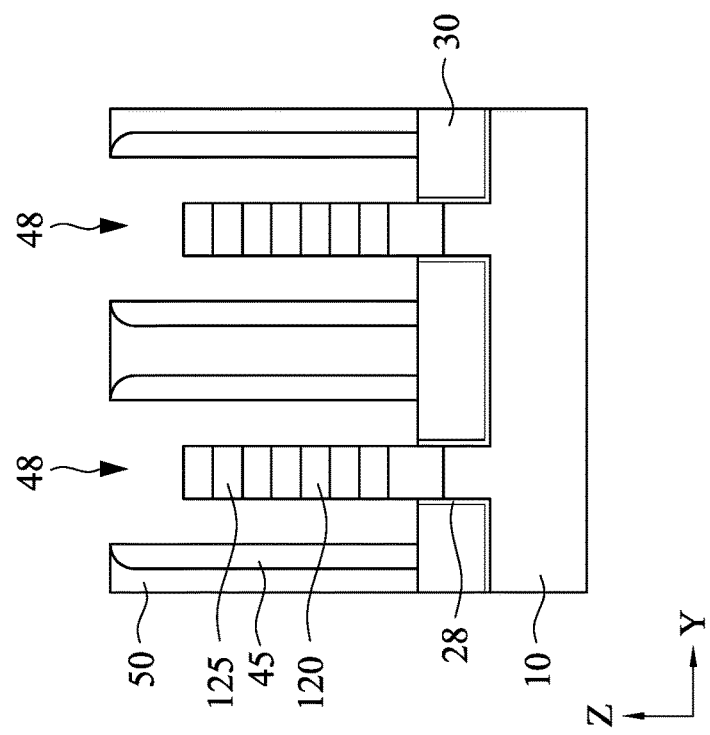

By using the similar operations explained with respect to FIGS. 5A-8B, gate spaces 48 are formed, in which the upper portions of the fin structures 121 are exposed, respectively, as shown in FIGS. 28A and 28B. FIG. 28A is a cross sectional view corresponding to line Y1-Y1 of FIG. 28B. In some embodiments, a part of the buffer semiconductor layer 127 is exposed in the opening 48. In other embodiments, the entire buffer semiconductor layer 127 is exposed, and in certain embodiments, the buffer semiconductor layer 127 is not exposed in the opening 48.

Figure 29B:
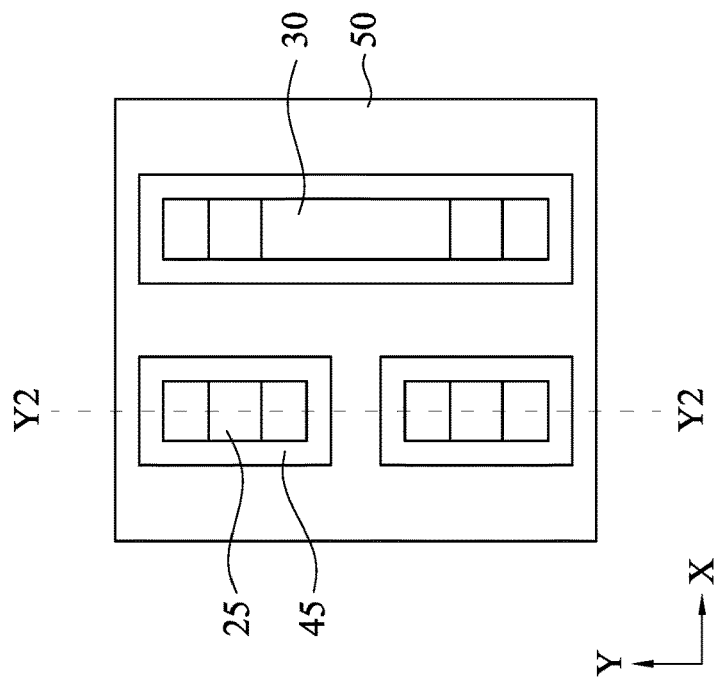
FIGS. 29A and 29B show one of the various stages of sequential processes for manufacturing a semiconductor device according to another embodiment of the present disclosure.
Figure 29A:
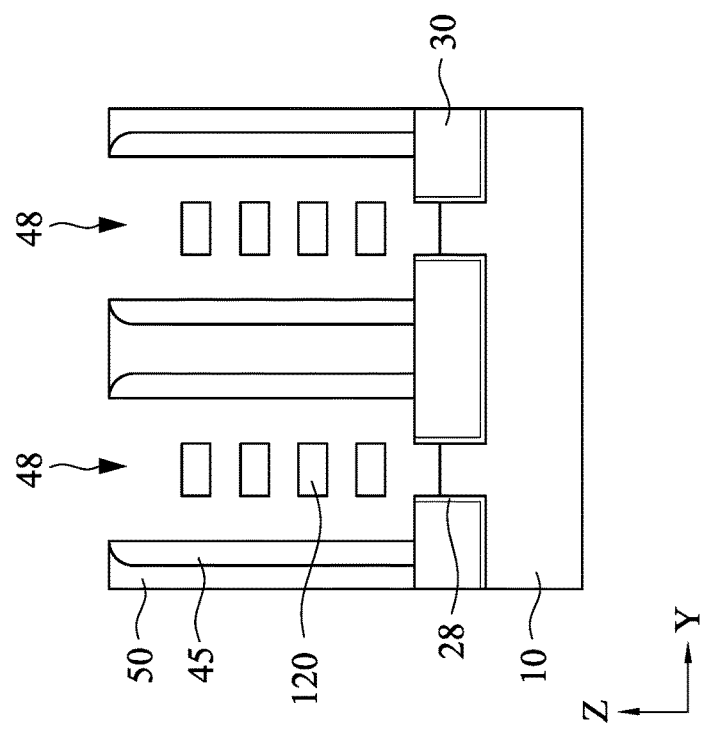

Then, the buffer semiconductor layer 127 and the second semiconductor layers 125 are removed in the gate opening 48, as shown in FIGS. 29A and 29B. FIG. 29A is a cross sectional view corresponding to line Y1-Y1 of FIG. 29B. The second semiconductor layers 125 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. Thus, semiconductor wires are formed of the first semiconductor layers 120.

Figure 30B:
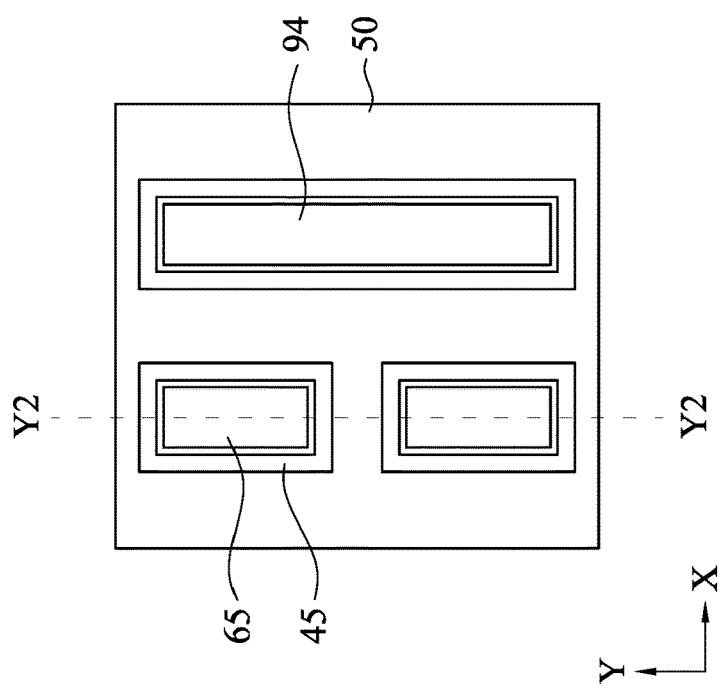
FIGS. 30A and 30B show one of the various stages of sequential processes for manufacturing a semiconductor device according to another embodiment of the present disclosure.
Figure 30A:
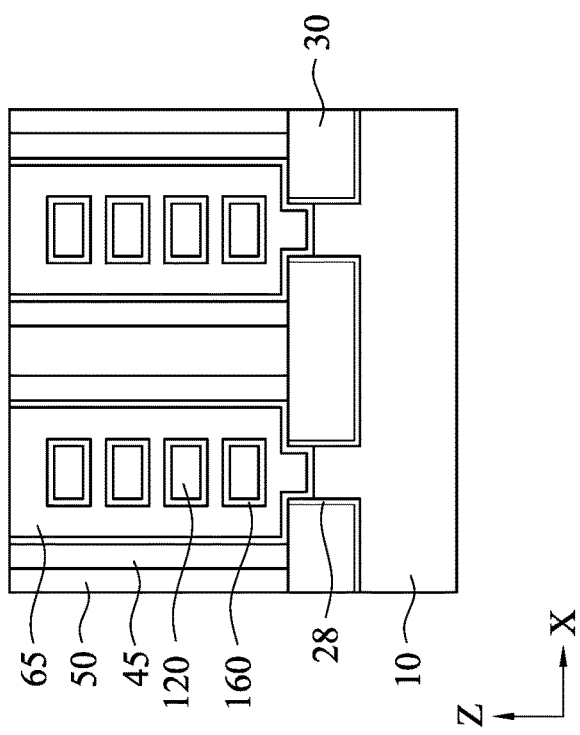

Then, by using the similar operations explained with respect to FIGS. 9A-10B, gate structures 65 are formed, as shown in FIGS. 30A and 30B. FIG. 30A is a cross sectional view corresponding to line Y2-Y2 of FIG. 30B.

Figure 31B:
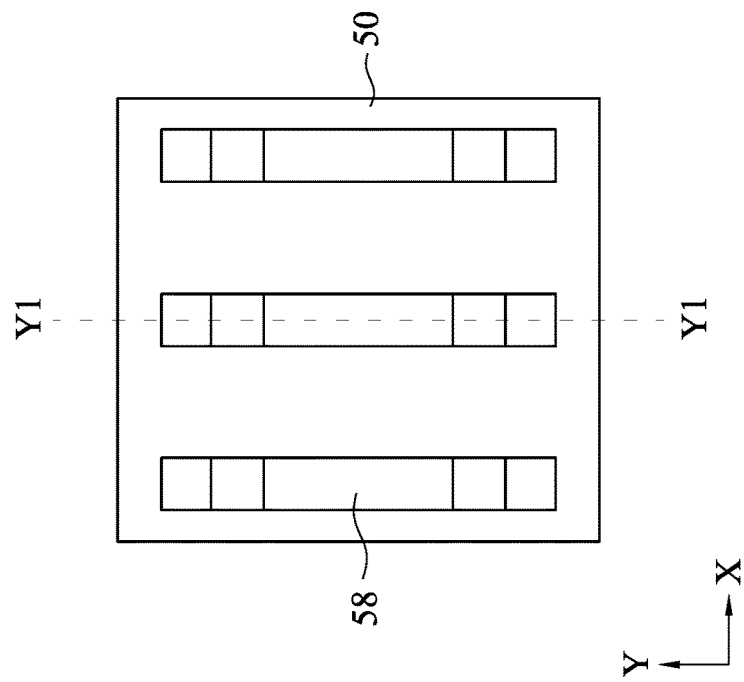
FIGS. 31A and 31B show one of the various stages of sequential processes for manufacturing a semiconductor device according to another embodiment of the present disclosure.
Figure 31A:
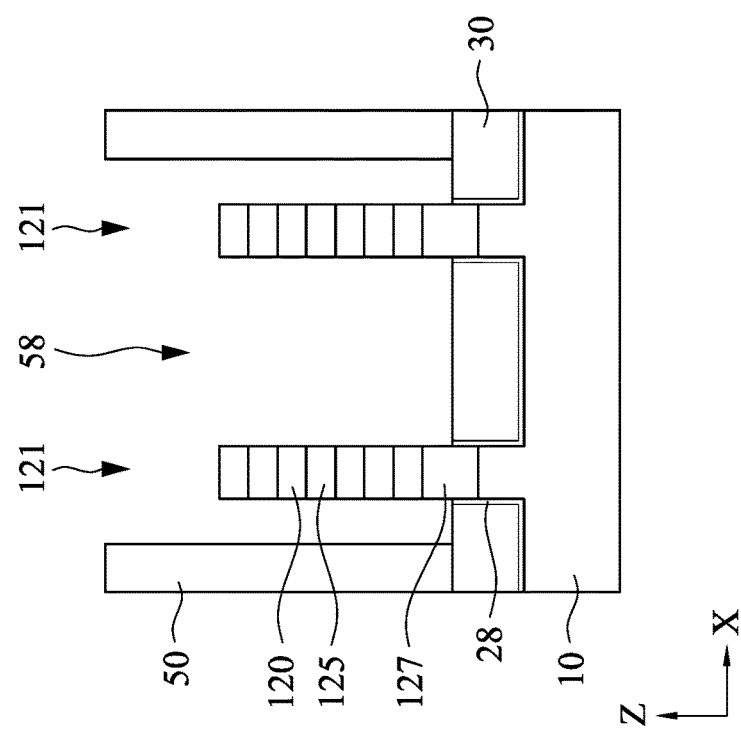

Further, by using the similar operations explained with respect to FIGS. 11A-12B, a source/drain opening 58 is formed by patterning the ILD layer 50 using one or more lithography and etching operations, as shown in FIGS. 31A and 31B. FIG. 31A is a cross sectional view corresponding to line Y1-Y1 of FIG. 31B. In the opening 58, the source/drain regions of the fin structure 121 are exposed.

Figure 32B:
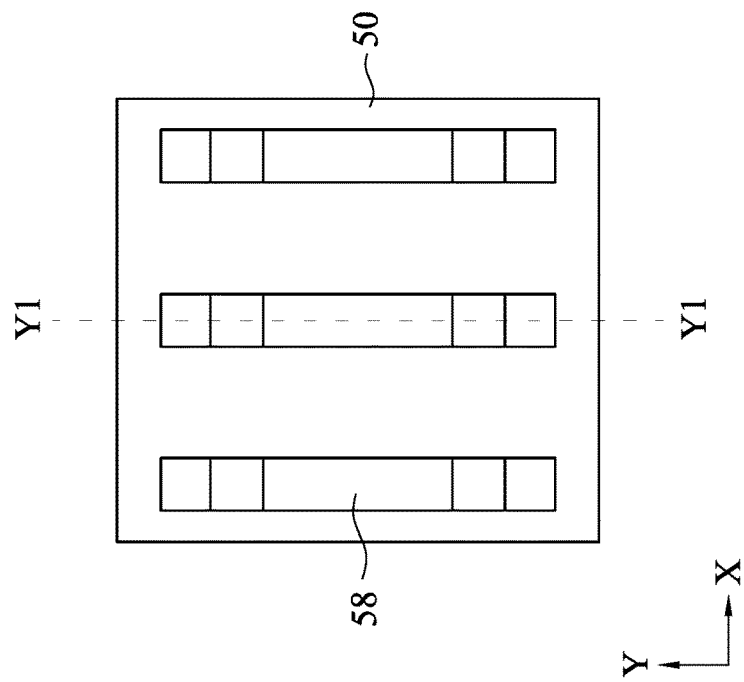
FIGS. 32A and 32B show one of the various stages of sequential processes for manufacturing a semiconductor device according to another embodiment of the present disclosure.
Figure 32A:
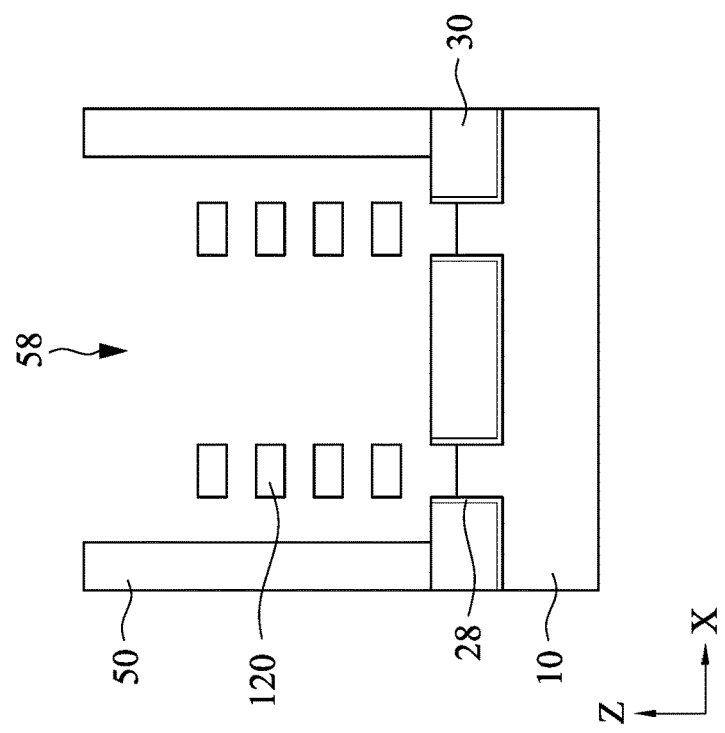

Then, the buffer semiconductor layer 127 and the second semiconductor layers 125 are removed in the source/drain opening 58, as shown in FIGS. 32A and 32B. FIG. 32A is a cross sectional view corresponding to line Y1-Y1 of FIG. 32B. The second semiconductor layers 125 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 33B:
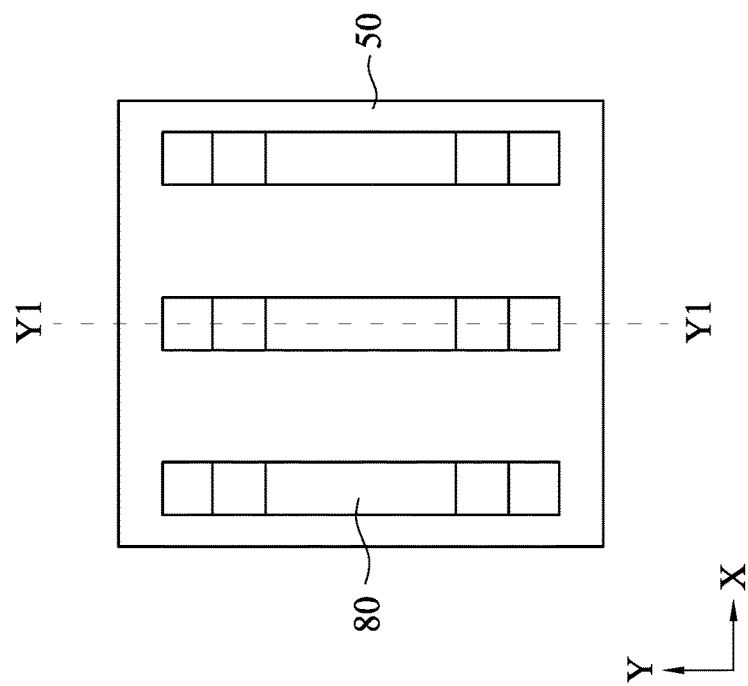
FIGS. 33A and 33B show one of the various stages of sequential processes for manufacturing a semiconductor device according to another embodiment of the present disclosure.
Figure 33A:
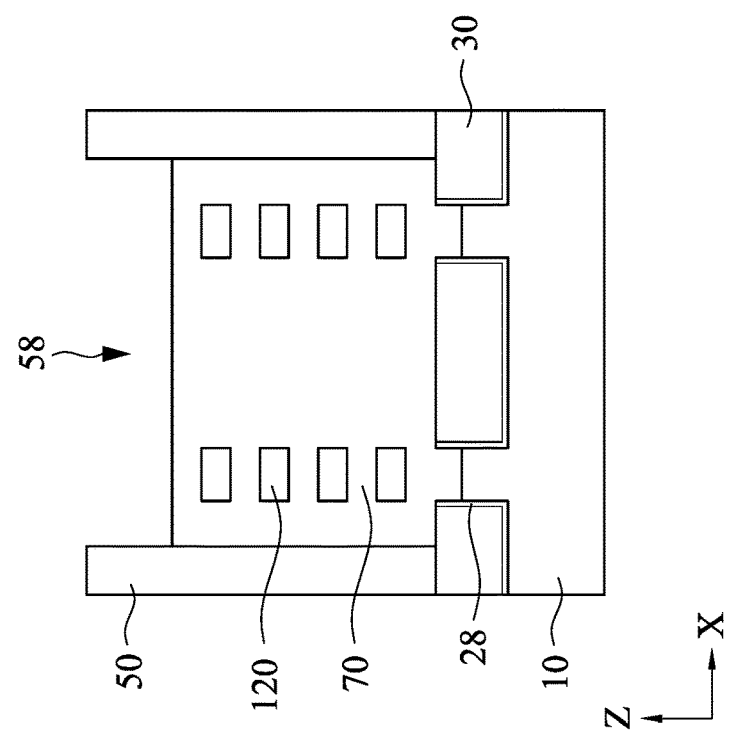

Subsequently, by using the similar operations explained with respect to FIGS. 13A-14B, a source/drain epitaxial layer 70 is formed, as shown in FIGS. 33A and 33B. FIG. 33A is a cross sectional view corresponding to line Y1-Y1 of FIG. 33B. As shown in FIG. 33A, the source/drain epitaxial layer 70 wraps around the source/drain region of the first semiconductor layers 121. No void is formed in the source/drain opening 58 by the source/drain epitaxial layer 70.

Figure 34B:
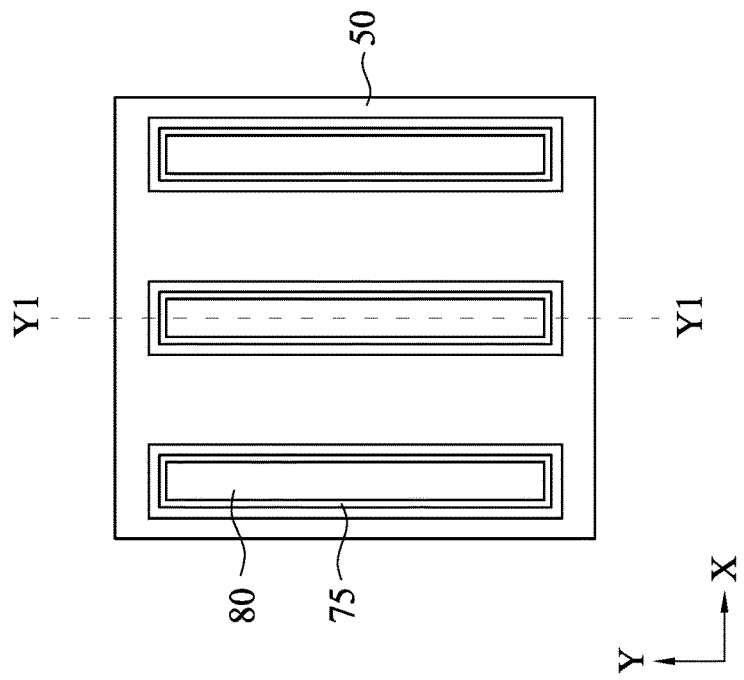
FIGS. 34A and 34B show one of the various stages of sequential processes for manufacturing a semiconductor device according to another embodiment of the present disclosure.
Figure 34A:
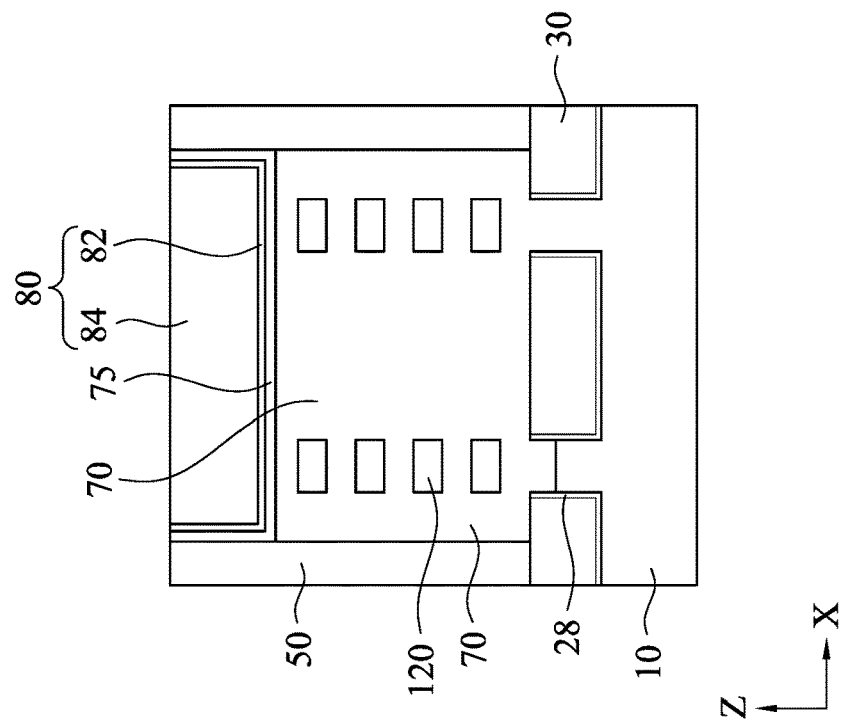

Further, by using the similar operations explained with respect to FIGS. 17A-17B, a interfacial layer 75 and a conductive contact 80 are formed, as shown in FIGS. 34A and 34B. FIG. 34A is a cross sectional view corresponding to line Y1-Y1 of FIG. 34B.

It is understood that the FinFETs and GAA FETs undergo further CMOS processes to form various features such as contacts/vias, interconnect metal layers, dielectric layers, passivation layers, etc.

In the foregoing embodiments, gate structures are first formed and then a source/drain epitaxial layer is formed. In other embodiments, the source/drain epitaxial layer and the interfacial semiconductor layer are formed while dummy gate structures are maintained, and then the gate structures are formed be removing the dummy gate structures. In such a case, one or more dielectric or other layers are formed after the interfacial semiconductor layer is formed, and these layers are patterned to form the conductive contact.

Figure 35A:
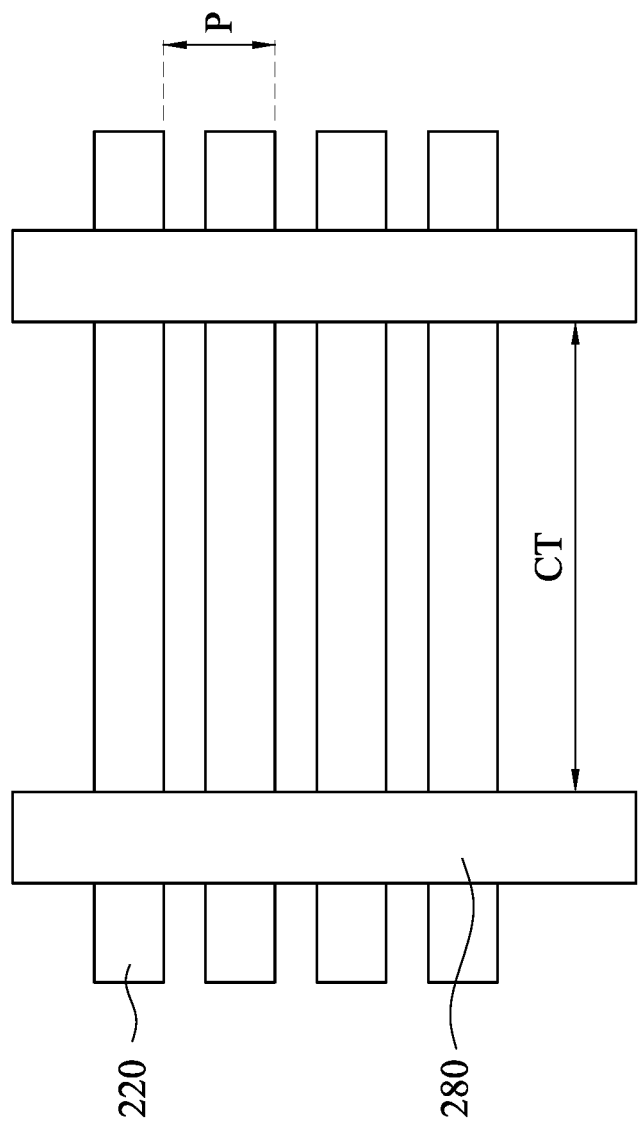
FIGS. 35A, 35B, 35C and 35D show simulation conditions.
Figure 35D:
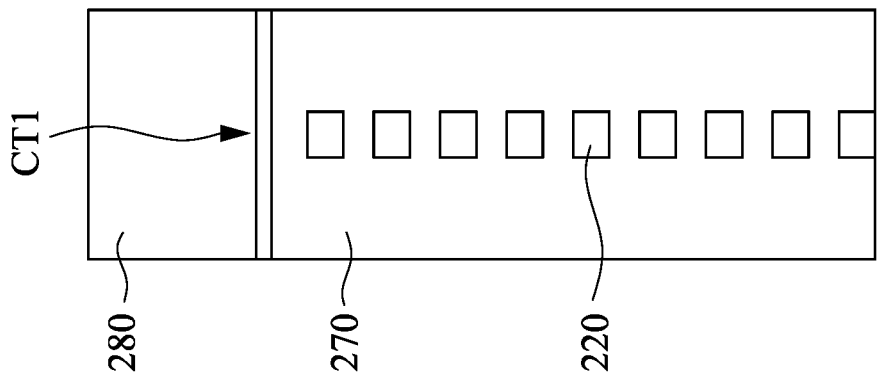
Figure 35C:
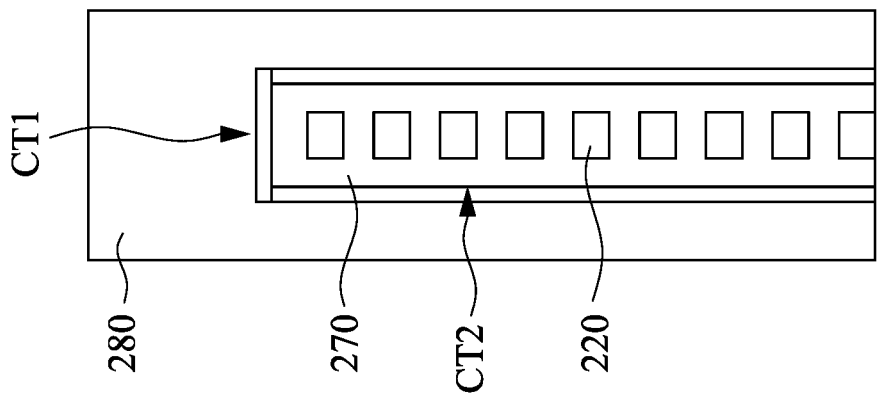
Figure 35B:
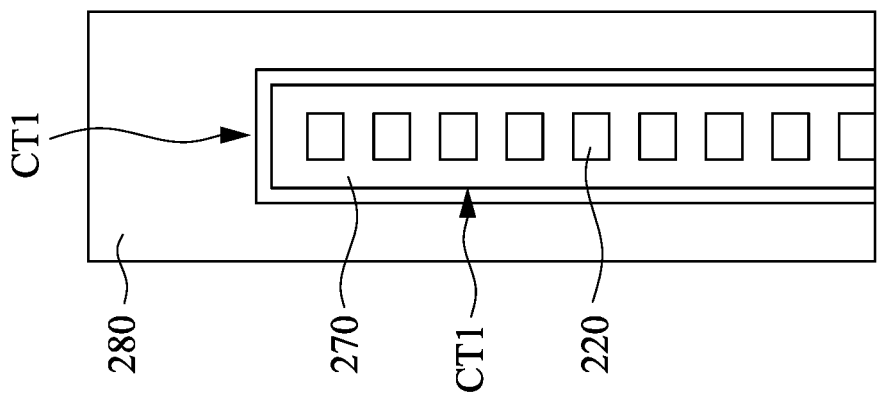

FIGS. 35A-36B show simulation results of contact resistance. As shown in FIG. 35A, which is a top (plan) view of a structure used in the simulation. Two contacts 280 are disposed over four groups of nano wires 280. The two contacts 280 are separated by a contact spacing CT. Three different contact structures shown in FIGS. 35B (structure B), 35C (structure C) and 35D (structure D) are tested. In the structures B-D, nine nano wires 220 made of Ge are stacked in the vertical direction, and a source/drain epitaxial layer 270 made of Ge:P surrounds the nano wires. Further, contact 280 is formed in contact with the source/drain epitaxial layer 270. In structure B, which corresponds to an ideal case, the contact 280 wraps around the source/drain epitaxial layer 270 with a contact resistance of $2\times10^{-19}$ $\Omega cm^2$ for all at three faces (the top and two sides). In structure C, which corresponds to a manufactured GAA FET case by a current production method, the contact 280 wraps around the source/drain epitaxial layer 270 with a contact resistance of $2\times10^{-19}$ $\Omega cm^2$ only for the top face and with a contact resistance of $1\times10^{-17}$ $\Omega cm^2$ for the two side faces, for example. Due to process conditions or some other factors, the contact resistance of the side faces becomes higher than that of the top face. For example, when a laser annealing is utilized, only the top of the epitaxial layer is effectively treated by the laser to decrease the contact resistance. In structure D, which corresponds to embodiments of the present disclosure, the contact 280 is formed on the top face of the source/drain epitaxial layer 270 with a contact resistance of $2\times10^{-19}$ $\Omega cm^2$.

Figure 36A:
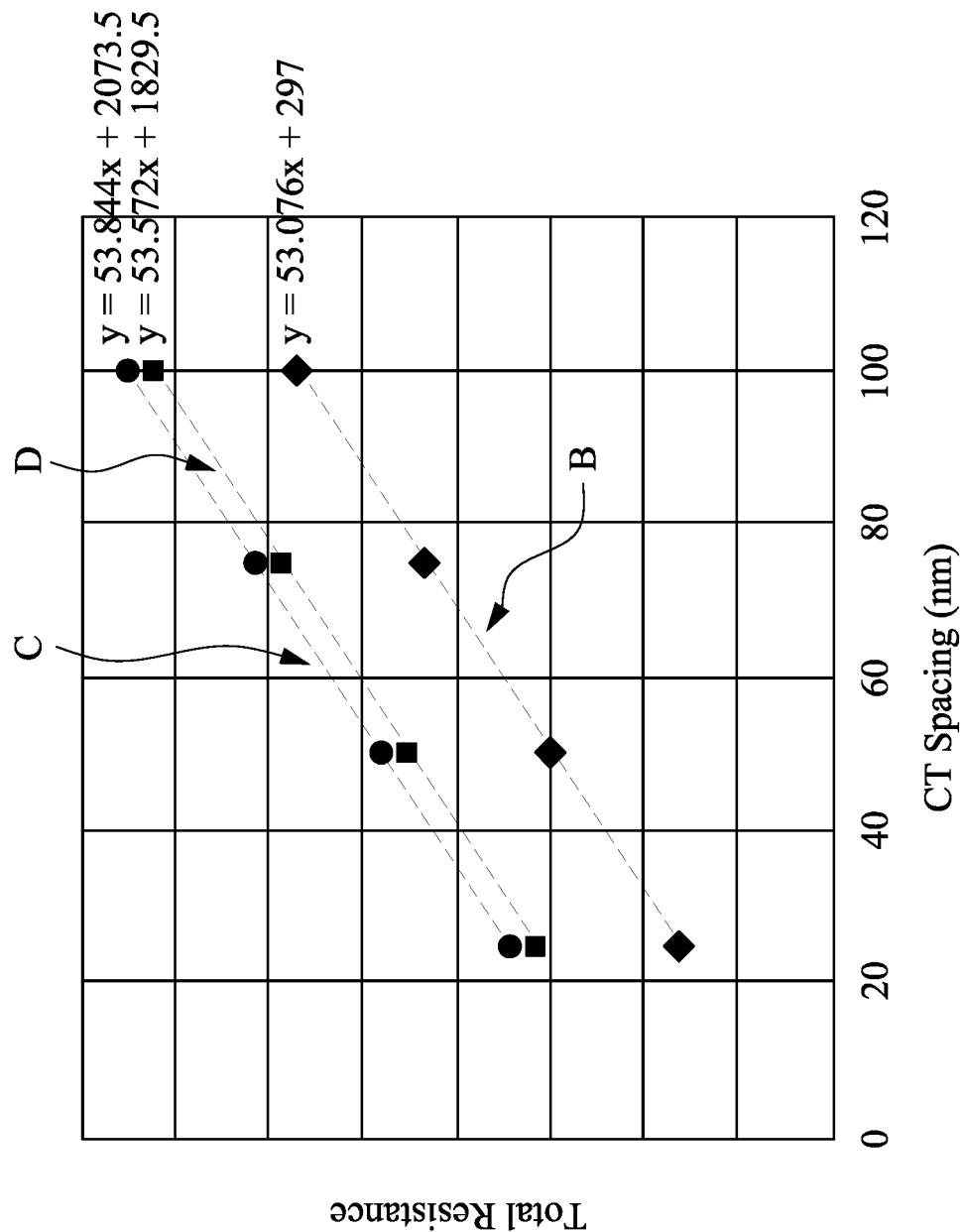
FIGS. 36A and 36B show simulated results.
Figure 36B:
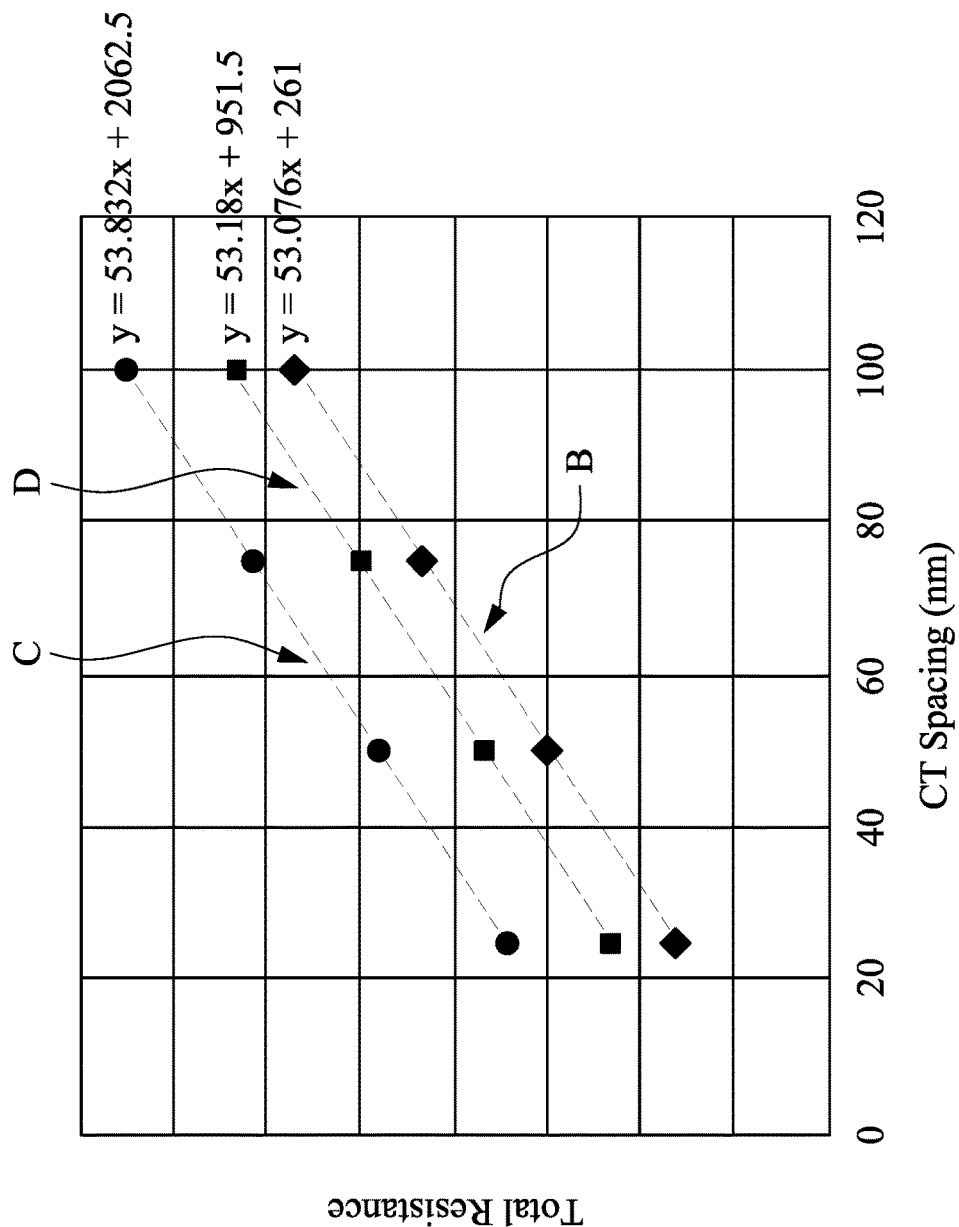

FIGS. 36A and 36B show calculated total resistance between two contacts 280. The total resistance includes a resistance of the nano wires and the contact resistance (two components, left and right). FIG. 36A is a case in which the pitch P of the group of nano wires is 24 nm, and FIG. 36B is a case in which the pitch P of the group of nano wires is 48 nm. As shown in FIGS. 36A and 36B, the structure D, which corresponds to the embodiments of the present disclosure, shows lower contact resistance values than the structure C, which corresponds to the manufactured case.

The various embodiments or examples described herein offer several advantages over the existing art. For example, in the present disclosure, by using a flat-top source/drain epitaxial layer with a conductive contact contacting on the flat-top, it is possible to reduce a contact resistance at a source/drain region of a FinFET or a GAA FET. Further, by providing a larger volume of the source/drain epitaxial layer than a wrap-around contact structure, it is possible to provide a higher amount of stress from the source/drain epitaxial layer to a channel region of FETs.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, an opening is formed in an interlayer dielectric layer such that a source/drain region is exposed in the opening. A first semiconductor layer is formed to fully cover the exposed source/drain region within the opening. A heating process is performed to make an upper surface of the first semiconductor layer substantially flat. A conductive contact layer is formed over the first semiconductor layer. In one or more of the foregoing or following embodiments, after the heating process is performed and before the conductive contact is formed, a second semiconductor layer is formed over the first semiconductor layer and an upper surface of the interlayer dielectric layer. In one or more of the foregoing or following embodiments, the first semiconductor layer is Ge or $Si_{1-x}Ge_x$, where 0.3<x<1. In one or more of the foregoing or following embodiments, the first semiconductor layer is doped with phosphorous. In one or more of the foregoing or following embodiments, the first semiconductor layer is epitaxially formed at a substrate temperature in a range from 350° C. to 410° C., and the heating process is performed at the substrate temperature in a range from 410° C. to 470° C. In one or more of the foregoing or following embodiments, the second semiconductor layer is Si or $Si_{1-y}Ge_y$, where 0<y<0.3, and the second semiconductor layer is formed at a substrate temperature in a range from 410° C. to 470° C. In one or more of the foregoing or following embodiments, the second semiconductor layer is amorphous or polycrystalline. In one or more of the foregoing or following embodiments, the second semiconductor layer is doped with phosphorous. In one or more of the foregoing or following embodiments, no void is formed at a bottom or sides of the first semiconductor layer. In one or more of the foregoing or following embodiments, side faces of the first semiconductor layer and side faces of the conductive contact are in contact with an inner wall of the opening.

In accordance with another aspect of the preset disclosure, in a method of manufacturing a semiconductor device, an opening is formed in an interlayer dielectric layer such that a source/drain region of a fin structure is exposed in the opening. The source/drain region of the fin structure protrudes from an isolation insulating layer. A first semiconductor layer is formed by an epitaxial growth to fully cover the exposed source/drain region within the opening. A heating process is performed to reflow the first semiconductor layer. A second semiconductor layer is formed over the first semiconductor layer. A conductive contact layer is formed on the second semiconductor layer. In one or more of the foregoing or following embodiments, after the heating process is performed, a thickness variation of the first semiconductor layer in the opening is less than or equal to 5 nm. In one or more of the foregoing or following embodiments, after the heating process is performed, the thickness variation of the first semiconductor layer in the opening is more than or equal to 0.2 nm. In one or more of the foregoing or following embodiments, after the second semiconductor layer is formed and before the conductive contact is formed, the first and second semiconductor layers are annealed. In one or more of the foregoing or following embodiments, the annealing operation is performed by a laser annealing method. In one or more of the foregoing or following embodiments, the forming the first semiconductor layer, the performing the heating process and the forming the second semiconductor layer are performed in a same manufacturing apparatus. In one or more of the foregoing or following embodiments, the heating process and the forming the second semiconductor layer are performed at a same substrate temperature. In one or more of the foregoing or following embodiments, a growth rate of the first semiconductor layer is in a range from 5 nm/min to 15 nm/min.

In accordance with another aspect of the present disclosure, in a method of manufacturing a semiconductor device, an opening is formed in an interlayer dielectric layer such that source/drain regions are exposed in the opening. A first semiconductor layer is formed to fully cover the exposed source/drain regions within the opening. A heating process is performed to make an upper surface of the first semiconductor layer substantially flat. A conductive contact layer is formed over the first semiconductor layer. In one or more of the foregoing or following embodiments, the source/drain regions are (i) portions of multiple fins protruding from an isolation insulating layer, or (ii) portions of semiconductor wires horizontally extending over the isolation insulating layer.

In accordance with one aspect of the present disclosure, a semiconductor device includes a gate structure disposed over a channel semiconductor layer, a source/drain region disposed on a side of the channel semiconductor layer, a first epitaxial semiconductor layer covering the source/drain region, a conductive contact disposed over the first epitaxial semiconductor layer, and a dielectric layer having an opening, a lower portion of which is filled by the first epitaxial semiconductor layer and an upper portion of which is filled by the conductive contact. In one or more of the foregoing or following embodiments, the semiconductor device further includes a second semiconductor layer disposed in the opening between the first epitaxial semiconductor layer and the conductive contact and between the dielectric layer and the conductive contact. In one or more of the foregoing or following embodiments, the first epitaxial semiconductor layer is Ge or $Si_{1-x}Ge_x$, where $0.3<x<1$. In one or more of the foregoing or following embodiments, the first epitaxial semiconductor layer is doped with phosphorous in an amount of $1\times10^{19}$ atoms/cm$^3$ to $1\times10^{20}$ atoms/cm$^3$. In one or more of the foregoing or following embodiments, the second semiconductor layer is Si or $Si_{1-y}Ge_y$, where $0<y<0.3$. In one or more of the foregoing or following embodiments, the second semiconductor layer is amorphous or polycrystalline. In one or more of the foregoing or following embodiments, the second semiconductor layer is doped with phosphorous in an amount of $1\times10^{20}$ atoms/cm$^3$ to $1\times10^{21}$ atoms/cm$^3$. In one or more of the foregoing or following embodiments, the source/drain region is Ge or $Si_{1-z}Ge_z$, where $0.3<z<1$. In one or more of the foregoing or following embodiments, no void is formed at a bottom or sides of the first epitaxial semiconductor layer. In one or more of the foregoing or following embodiments, side faces of the first epitaxial semiconductor layer and side faces of the conductive contact are in contact with an inner wall of the opening. In one or more of the foregoing or following embodiments, a thickness variation of the first epitaxial semiconductor layer in the opening is less than or equal to 5 nm. In one or more of the foregoing or following embodiments, the thickness variation of the first epitaxial semiconductor layer in the opening is more than or equal to 0.2 nm. In one or more of the foregoing or following embodiments, the first epitaxial semiconductor layer is doped with boron in an amount of $1\times10^{19}$ atoms/cm$^3$ to $1\times10^{20}$ atoms/cm$^3$. In one or more of the foregoing or following embodiments, the first epitaxial semiconductor layer is doped with gallium in an amount of $1\times10^{19}$ atoms/cm$^3$ to $1\times10^{20}$ atoms/cm$^3$.

In accordance with another aspect of the present disclosure, a semiconductor device includes channel semiconductor layers disposed over a substrate, source/drain regions disposed on sides of the channel semiconductor layers, a gate structure disposed over at least one of the channel semiconductor layers, a first semiconductor layer covering the source/drain regions, a second semiconductor layer made of a different material than the first semiconductor layer and disposed on the first semiconductor layer, a conductive contact disposed over the second semiconductor layer, and a dielectric layer having an opening, a lower portion of which is filled by the first epitaxial semiconductor layer and an upper portion of which is filled by the second semiconductor layer and the conductive contact. In one or more of the foregoing or following embodiments, a thickness variation of the first epitaxial semiconductor layer in the opening is less than or equal to 5.0 nm. In one or more of the foregoing or following embodiments, a thickness variation of the first epitaxial semiconductor layer in the opening is less than or equal to 3.0 nm. In one or more of the foregoing or following embodiments, the thickness variation of the first epitaxial semiconductor layer in the opening is more than or equal to 0.2 nm. In one or more of the foregoing or following embodiments, no void is formed between the source/drain regions.

In accordance with another aspect of the present disclosure, a semiconductor device includes semiconductor wires arranged in a vertical direction over a substrate, and having channel regions and source/drain regions, respectively, a gate structure surrounding the channel regions, a first semiconductor layer covering the source/drain regions, a second semiconductor layer made of a different material than the first semiconductor layer and disposed on the first semiconductor layer, and a conductive contact disposed over the second semiconductor layer. A thickness variation of the first epitaxial semiconductor layer is less than or equal to 5.0 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming an opening in an interlayer dielectric layer such that a source/drain region is exposed in the opening;
    forming a first semiconductor layer to fully cover the exposed source/drain region within the opening;
    performing a heating process to make an upper surface of the first semiconductor layer substantially flat; and
    forming a conductive contact layer over the first semiconductor layer.

2. The method of claim 1, further comprising, after the heating process is performed and before the conductive contact is formed, forming a second semiconductor layer over the first semiconductor layer and an upper surface of the interlayer dielectric layer.

3. The method of claim 1, wherein the first semiconductor layer is Ge or $Si_{1-x}Ge_x$, where $0.3<x<1$.

4. The method of claim 3, wherein the first semiconductor layer is doped with phosphorous.

5. The method of claim 3, wherein:
    the first semiconductor layer is epitaxially formed at a substrate temperature in a range from 350° C. to 410° C., and
    the heating process is performed at the substrate temperature in a range from 410° C. to 470° C.

6. The method of claim 3, wherein:
    the second semiconductor layer is Si or $Si_{1-y}Ge_y$, where $0<y<0.3$, and
    the second semiconductor layer is formed at a substrate temperature in a range from 410° C. to 470° C.

7. The method of claim 6, wherein the second semiconductor layer is amorphous or polycrystalline.

8. The method of claim 6, wherein the second semiconductor layer is doped with phosphorous.

9. The method of claim 1, wherein no void is formed at a bottom or sides of the first semiconductor layer.

10. The method of claim 1, wherein side faces of the first semiconductor layer and side faces of the conductive contact are in contact with an inner wall of the opening.

11. A method of manufacturing a semiconductor device, the method comprising:
   forming an opening in an interlayer dielectric layer such that a source/drain region of a fin structure is exposed in the opening, the source/drain region of the fin structure protruding from an isolation insulating layer;
   forming a first semiconductor layer by an epitaxial growth to fully cover the exposed source/drain region within the opening;
   performing a heating process to reflow the first semiconductor layer;
   forming a second semiconductor layer over the first semiconductor layer; and
   forming a conductive contact layer on the second semiconductor layer.

12. The method of claim 11, wherein after the heating process is performed, a thickness variation of the first semiconductor layer in the opening is less than or equal to 5 nm.

13. The method of claim 12, wherein after the heating process is performed, the thickness variation of the first semiconductor layer in the opening is more than or equal to 0.2 nm.

14. The method of claim 11, further comprising, after the second semiconductor layer is formed and before the conductive contact is formed, annealing the first and second semiconductor layers.

15. The method of claim 14, wherein the annealing operation is performed by a laser annealing method.

16. The method of claim 11, wherein the forming the first semiconductor layer, the performing the heating process and the forming the second semiconductor layer are performed in a same manufacturing apparatus.

17. The method of claim 11, wherein the heating process and the forming the second semiconductor layer are performed at a same substrate temperature.

18. The method of claim 11, wherein a growth rate of the first semiconductor layer is in a range from 5 nm/min to 15 nm/min.

19. A method of manufacturing a semiconductor device, the method comprising:
   forming an opening in an interlayer dielectric layer such that source/drain regions are exposed in the opening;
   forming a first semiconductor layer to fully cover the exposed source/drain regions within the opening;
   performing a heating process to make an upper surface of the first semiconductor layer substantially flat; and
   forming a conductive contact layer over the first semiconductor layer.

20. The method of claim 19, wherein the source/drain regions are (i) portions of multiple fins protruding from an isolation insulating layer, or (ii) portions of semiconductor wires horizontally extending over the isolation insulating layer.

* * * * *